(12) United States Patent
Ito

(10) Patent No.: US 10,770,215 B2
(45) Date of Patent: Sep. 8, 2020

(54) ELECTRONIC COMPONENT, DIAPHRAGM, ELECTRONIC DEVICE, AND ELECTRONIC COMPONENT MANUFACTURING METHOD

(71) Applicant: Murata Manufacturing Co., Ltd., Nagaokakyo-shi, Kyoto-fu (JP)

(72) Inventor: Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 168 days.

(21) Appl. No.: 16/195,917

(22) Filed: Nov. 20, 2018

(65) Prior Publication Data

US 2019/0088403 A1 Mar. 21, 2019

Related U.S. Application Data

(63) Continuation of application No. PCT/JP2017/021254, filed on Jun. 8, 2017.

(30) Foreign Application Priority Data

Jun. 17, 2016 (JP) .................. 2016-120892
Feb. 24, 2017 (JP) .................. 2017-033470

(51) Int. Cl.
*H01F 17/00* (2006.01)
*H01F 41/04* (2006.01)
(Continued)

(52) U.S. Cl.
CPC .......... *H01F 17/0013* (2013.01); *H01F 7/08* (2013.01); *H01F 17/0006* (2013.01);
(Continued)

(58) Field of Classification Search
CPC ............ H01F 27/2804; H01F 17/0006; H01F 27/292; H01F 17/0013; H01F 7/08;
(Continued)

(56) References Cited

U.S. PATENT DOCUMENTS

2008/0087493 A1 4/2008 Ikeda et al.
2011/0248380 A1 10/2011 Yoshihara et al.
(Continued)

FOREIGN PATENT DOCUMENTS

JP    60-052668 U    4/1985
JP    07-066606 A    3/1995
(Continued)

OTHER PUBLICATIONS

Official Communication issued in International Patent Application No. PCT/JP2017/021254, dated Sep. 12, 2017.

*Primary Examiner* — Mohamad A Musleh
(74) *Attorney, Agent, or Firm* — Keating & Bennett, LLP

(57) ABSTRACT

An electronic component includes an insulating base material substrate including a first main surface defining a mounting surface, a coil on the insulating base material substrate, and a mounting electrode on the first main surface and connected to the coil. The insulating base material substrate includes insulating base material layers laminated in a lamination direction. The coil includes a coil conductor provided on one of the insulating base material layers and a winding axis extending in the lamination direction. An area of the first main surface is smaller than an area of a section different in area from the first main surface and is closest to the first main surface, among sections parallel or substantially parallel to the first main surface.

20 Claims, 25 Drawing Sheets

(51) Int. Cl.
*H01F 27/29* (2006.01)
*H01F 27/06* (2006.01)
*H01F 7/08* (2006.01)
*H01F 27/28* (2006.01)
*H05K 1/16* (2006.01)
*H05K 3/46* (2006.01)
*H05K 3/00* (2006.01)
*H05K 1/18* (2006.01)

(52) U.S. Cl.
CPC ......... *H01F 27/06* (2013.01); *H01F 27/2804* (2013.01); *H01F 27/29* (2013.01); *H01F 27/292* (2013.01); *H01F 41/041* (2013.01); *H05K 1/165* (2013.01); *H01F 2017/0046* (2013.01); *H01F 2017/0073* (2013.01); *H01F 2027/2809* (2013.01); *H05K 1/181* (2013.01); *H05K 3/0052* (2013.01); *H05K 3/4632* (2013.01); *H05K 2201/09036* (2013.01); *H05K 2201/09154* (2013.01); *H05K 2201/09827* (2013.01); *H05K 2201/10083* (2013.01); *H05K 2201/10977* (2013.01)

(58) Field of Classification Search
CPC ........ H01F 41/041; H01F 27/06; H01F 27/29; H01F 2017/0073; H01F 2017/0046; H01F 2027/2809; H05K 1/165; H05K 3/4632; H05K 2201/09154; H05K 2201/10977; H05K 3/0052; H05K 1/181; H05K 2201/09036; H05K 2201/09827; H05K 2201/10083

See application file for complete search history.

(56) References Cited

U.S. PATENT DOCUMENTS

| | | |
|---|---|---|
| 2012/0267662 A1 | 10/2012 | Maute et al. |
| 2014/0105445 A1 | 4/2014 | Kim |
| 2016/0027578 A1 | 1/2016 | Nishino et al. |
| 2016/0055967 A1 | 2/2016 | Nishino et al. |

FOREIGN PATENT DOCUMENTS

| | | |
|---|---|---|
| JP | 11-8157 A | 1/1999 |
| JP | 2006-287924 A | 10/2006 |
| JP | 2009-034694 A | 2/2009 |
| JP | 2010-010321 A | 1/2010 |
| JP | 2011-238895 A | 11/2011 |
| JP | 2012-060013 A | 3/2012 |
| JP | 2013-501350 A | 1/2013 |
| JP | 2014-517594 A | 7/2014 |
| WO | 2014/115433 A1 | 7/2014 |
| WO | 2015/079941 A1 | 6/2015 |
| WO | 2015/129601 A1 | 9/2015 |

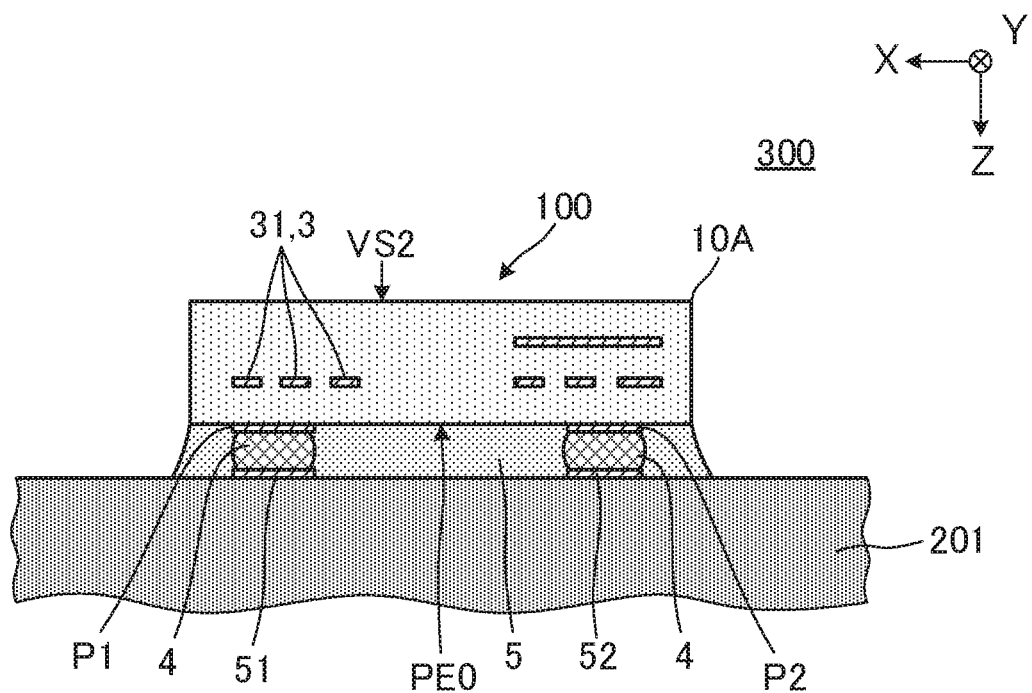

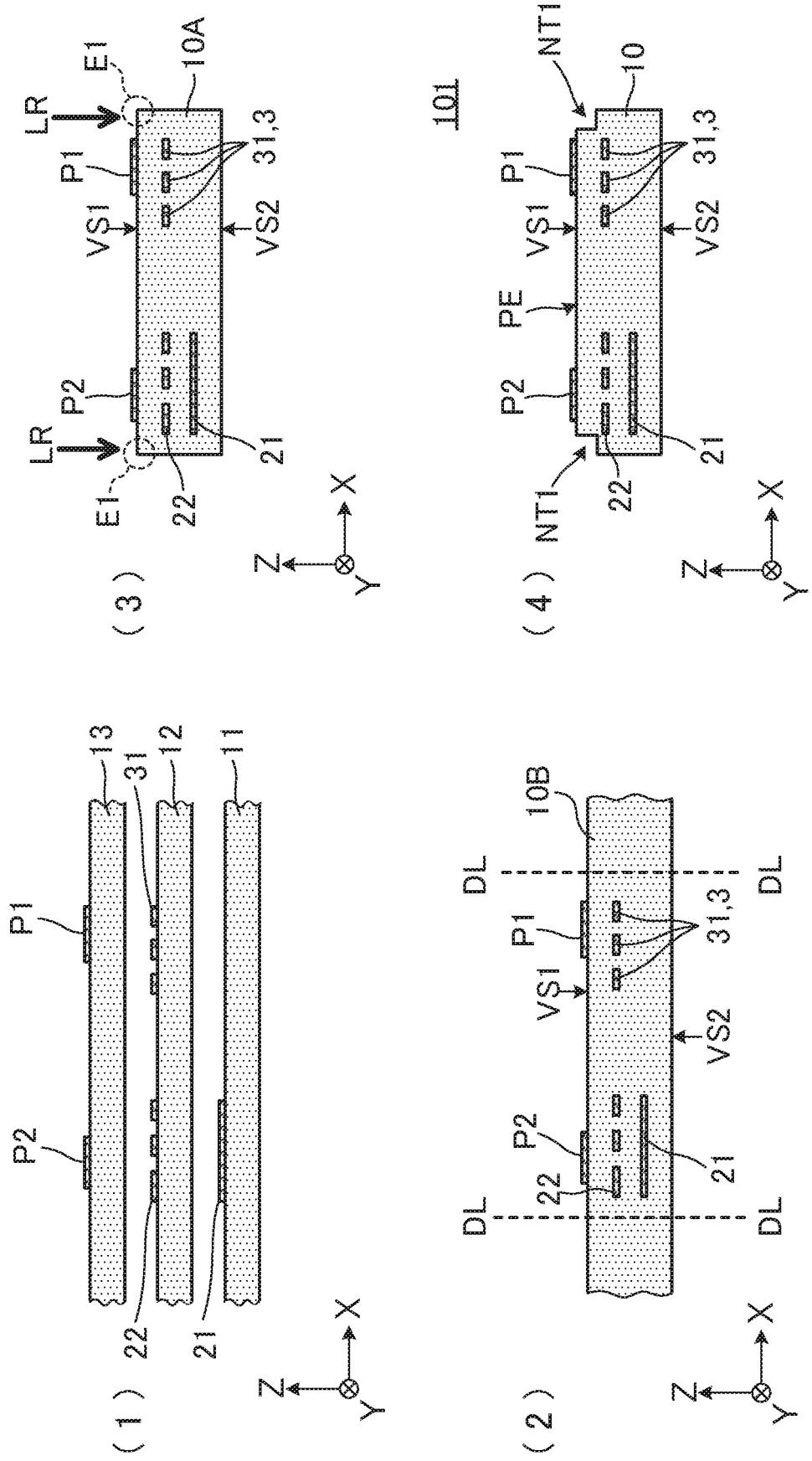

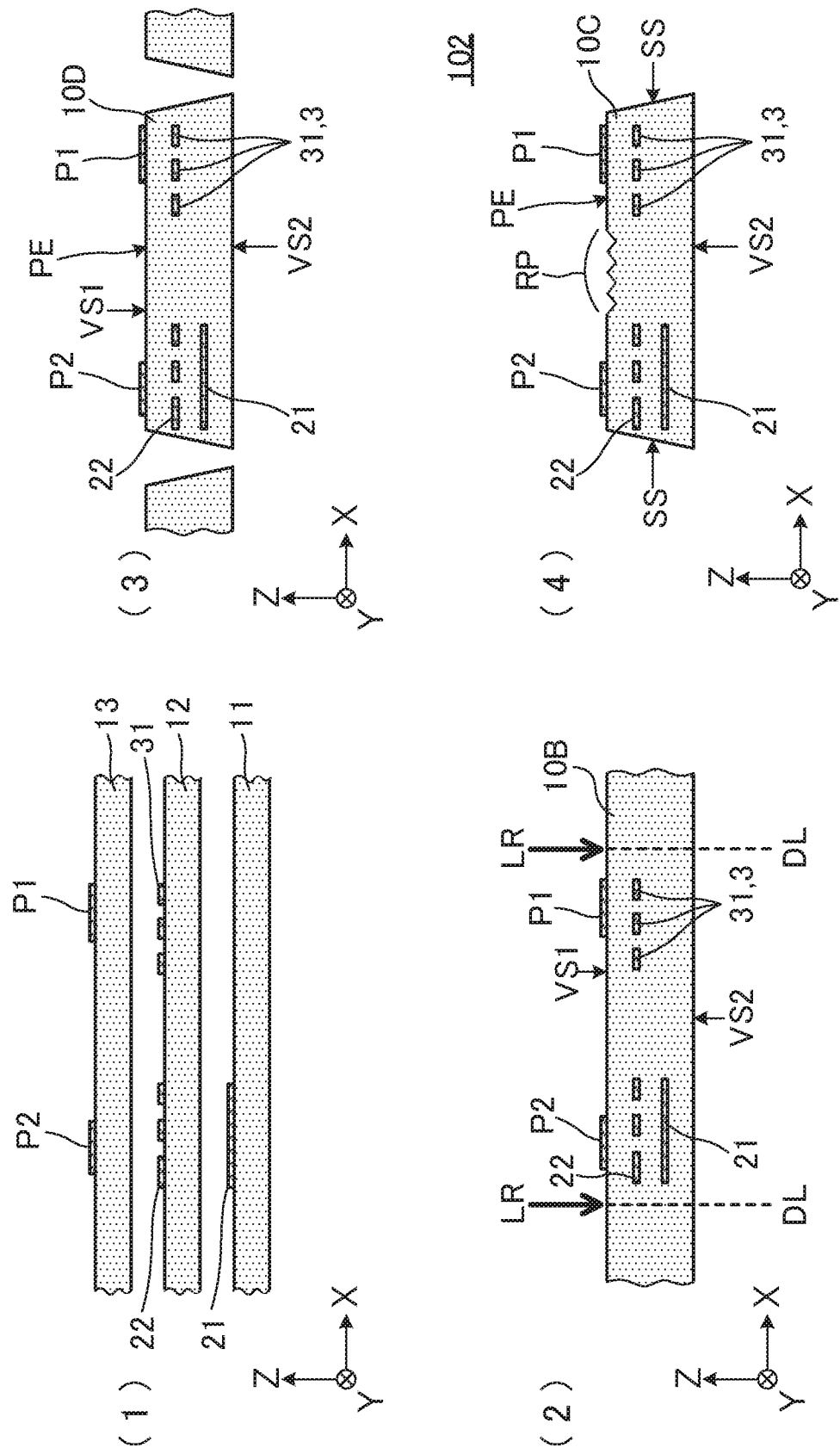

ELECTRONIC COMPONENT, DIAPHRAGM, ELECTRONIC DEVICE, AND ELECTRONIC COMPONENT MANUFACTURING METHOD

CROSS REFERENCE TO RELATED APPLICATIONS

This application claims the benefit of priority to Japanese Patent Application No. 2016-120892 filed on Jun. 17, 2016 and Japanese Patent Application No. 2017-033470 filed on Feb. 24, 2017, and is a Continuation Application of PCT Application No. PCT/JP2017/021254 filed on Jun. 8, 2017. The entire contents of these applications are hereby incorporated herein by reference.

BACKGROUND OF THE INVENTION

1. Field of the Invention

The present invention relates to an electronic component, particularly to an electronic component in which a coil is provided on a laminated body, a diaphragm, an electronic device including the electronic component, and a method for manufacturing the electronic component.

2. Description of the Related Art

Various electronic components, in which the coil is provided on an insulating base material provided by laminating a plurality of insulating base material layers, are conventionally known. For example, WO 2014/115433 discloses an electronic component including a winding axis in a laminating direction of the plurality of insulating base material layers, and a mounting electrode provided only on a mounting surface of the insulating base material. The electronic component is mounted on a mounting substrate or the like (hereinafter referred to as another member).

However, in the electronic component having the above configuration, when a large mounting electrode is provided on the mounting surface, the mounting electrode may interfere with a magnetic flux passing through the coil. In order to prevent the interference of the magnetic flux passing through the coil, it is possible to reduce an area of the mounting electrode. However, when such a mounting electrode is bonded to a conductor pattern provided on another member with a conductive bonding material, such as solder interposed therebetween, there is a risk that sufficient bonding strength to another member is not able to be secured because of the small area of the mounting electrode.

It is also possible that the above configuration is applied to a diaphragm. Similarly to the above electronic component, the diaphragm includes the mounting electrode that is provided to be connected to another member. When the diaphragm vibrates, stress is applied to a portion (hereinafter, referred to as a bonding portion) in which the diaphragm is bonded to another member. For this reason, in the case in which the mounting electrode of the diaphragm is bonded to another member only with the conductive bonding material, the stress is concentrated on an interface between the insulating base material and the conductive bonding material, and there is a risk of easily peeling off the diaphragm from another member.

On the other hand, in the case in which the electronic component and the diaphragm are mounted on another member, or in the case in which the diaphragm is bonded to another member, it is possible that the mounting surface or the bonding portion other than the mounting electrode is bonded (fixed) to another member using an insulating bonding material (underfill or the like).

However, even in the above bonding method, because a bonding between an insulating base material layer defining an insulating base material and an insulating bonding material (or between the insulating base material layer and another member) requires bonding of a dissimilar material, sufficient bonding strength is not able to be secured such that a risk of dropping or detaching the electronic component or the diaphragm from another member is generated.

SUMMARY OF THE INVENTION

Preferred embodiments of the present invention provide electronic components and diaphragms in each of which sufficient bonding strength to another member is able to be easily be secured in mounting the electronic component and the diaphragm on another member using the conductive bonding material and the insulating bonding material, and electronic devices including another member on which the electronic components are mounted. In addition, preferred embodiments of the present invention provide methods of manufacturing the electronic components.

According to a preferred embodiment of the present invention, an electronic component includes an insulating base material substrate including a first main surface defining a mounting surface, the insulating base material substrate including a plurality of insulating base material layers that are laminated; a coil including a coil conductor provided on the insulating base material layer and including a winding axis in a laminating direction of the plurality of insulating base material layers; and a mounting electrode that is provided on the first main surface and connected to the coil. An area of the first main surface is smaller than an area of a section, which is different from the first main surface in the area and is closest to the first main surface, among sections parallel or substantially parallel to the first main surface, and the entire or substantially the entire first main surface is disposed inside a section having the largest area among the sections parallel or substantially parallel to the first main surface when viewed from the laminating direction.

With this configuration, the bonding strength between the electronic component and the insulating bonding material is improved without enlarging a mounting area of the electronic component including the insulating bonding material, and the electronic component in which bonding reliability to mounting substrate is improved is obtained.

In an electronic component according to a preferred embodiment of the present invention, preferably a plurality of coil conductors are provided, and the plurality of coil conductors are provided on at least two insulating base material layers of the plurality of insulating base material layers. With this configuration, the electronic component including the coil having a predetermined number of windings and inductance is obtained.

In an electronic component according to a preferred embodiment of the present invention, the insulating base material substrate may include a second main surface opposed to the first main surface, and the insulating base material substrate may have a tapered shape in which the area of the first main surface is smaller than the area of the second main surface.

In an electronic component according to a preferred embodiment of the present invention, the insulating base material substrate may include a recess provided in at least a portion of an outer edge of the first main surface.

In an electronic component according to a preferred embodiment of the present invention, preferably an uneven portion is provided in an electrode non-forming portion in which the mounting electrode is not provided in the first main surface. With this configuration, a surface area of the electrode non-forming portion that contacts the insulating bonding material while being mounted on the mounting substrate is larger as compared with the case in which the uneven portion is not provided in the electrode non-forming portion, so that the bonding strength between the insulating base material substrate and the insulating bonding material is further improved.

According to a preferred embodiment of the present invention, a diaphragm that vibrates by electromagnetic force includes a support film having flexibility; a wiring conductor provided on the support film; and an electronic component that is bonded to the support film with a conductive bonding material and an insulating bonding material interposed therebetween. The electronic component includes an insulating base material substrate including a first main surface defining a mounting surface, the insulating base material substrate including a plurality of insulating base material layers that are laminated; a coil including a coil conductor provided on the insulating base material layer; and a mounting electrode that is provided on the first main surface and connected to the coil, and an area of the first main surface is smaller than an area of a section, which is different from the first main surface in the area and is closest to the first main surface, among sections parallel or substantially parallel to the first main surface.

In the case in which the diaphragm is bonded to the support film only using the conductive bonding material, the stress is concentrated on the interface between the mounting electrode of the diaphragm and the conductive bonding material during the vibration, and the diaphragm is easily peeled off from the support film. When the diaphragm vibrates repeatedly, the stress is generated at the interface between the insulating base material substrate and the support film, and the peeling is easily generated at the interface between the electrode non-forming portion and the insulating bonding material. On the other hand, according to this configuration, as compared with the case in which only the electrode non-forming portion of the insulating base material substrate is bonded to the support film with the insulating bonding material substrate interposed therebetween, the area in which the insulating base material substrate contacts the insulating bonding material is increased to improve the bonding strength between the insulating base material substrate and the insulating bonding material. Thus, the diaphragm in which the peeling of the interface between the insulating base material substrate and the insulating bonding material is prevented to improve the bonding reliability to the support film is obtained.

In a diaphragm according to a preferred embodiment of the present invention, the insulating base material substrate may include a recess provided at an outer edge of the first main surface.

According to a preferred embodiment of the present invention, a diaphragm that vibrates by electromagnetic force includes an insulating base material substrate including a vibrator that vibrates, a support fixed to another member, a first main surface including a bonding portion bonded to the another member, the insulating base material substrate including a plurality of insulating base material layers that are laminated; a coil including a coil conductor provided on the insulating base material layer; and a mounting electrode provided on the first main surface and connected to the coil. An area of the first main surface is smaller than an area of a section, which is different from the first main surface in the area and closest to the first main surface, among sections parallel or substantially parallel to the first main surface.

When the diaphragm vibrates, the stress is applied to the bonding portions of the support. In the case in which the diaphragm is bonded to another member only with the conductive bonding material, there is a large difference in physical property between the insulating base material substrate and the conductive bonding material (the insulating base material substrate is greatly different from conductive bonding material in the elastic modulus), so that the stress is concentrated on the interface between the mounting electrode of the diaphragm and the conductive bonding material during the vibration to easily peel off the diaphragm from another member. When the diaphragm vibrates repeatedly, the stress is generated at the interface between the bonding portion of the support and another member, and the peeling is easily generated at the interface between the insulating base material substrate and the insulating bonding material. On the other hand, according to this configuration, as compared with the case in which only the first main surface side of the support is bonded to another member with the insulating bonding material interposed therebetween, a surface area of a portion in which the insulating base material substrate contacts with the insulating bonding material is increased to improve bonding strength between the insulating base material substrate and the insulating bonding material. Thus, the diaphragm in which the peeling of the interface between the insulating base material substrate and the insulating bonding material is prevented is obtained.

In a diaphragm according to a preferred embodiment of the present invention, the insulating base material substrate may include a recess provided at an outer edge of the support of the first main surface.

In a diaphragm according to a preferred embodiment of the present invention, preferably a width of the support is narrower than a width of the vibrator. With this configuration, the vibrator easily vibrates by electromagnetic force, and a diaphragm having a large amplitude is obtained.

According to a preferred embodiment of the present invention, an electronic device includes a mounting substrate; and an electronic component mounted on the mounting substrate using a conductive bonding material and an insulating bonding material. The electronic component includes an insulating base material substrate including a first main surface defining a mounting surface, the insulating base material substrate including a plurality of insulating base material layers that are laminated; a coil that includes a coil conductor provided on the insulating base material layer and includes a winding axis in a laminating direction of the plurality of insulating base material layers; and a mounting electrode that is provided on the first main surface and connected to the coil, an area of the first main surface is smaller than an area of a section, which is different from the first main surface in the area and is closest to the first main surface, among sections parallel or substantially parallel to the first main surface, the entire first main surface is disposed inside a section having the largest area among the sections parallel or substantially parallel to the first main surface when viewed from the laminating direction, the mounting electrode is connected to the mounting substrate with the conductive bonding material interposed therebetween, the insulating base material substrate includes a recess provided in an end surface connected to the first main surface or an outer edge of the first main surface, and an electrode non-forming portion in which the mounting electrode is not provided in the first main surface is bonded to the mounting substrate together with at least a portion of the end surface or the recess with the insulating bonding material interposed therebetween.

With this configuration, as compared with the case in which only the electrode non-forming portion is bonded to the mounting substrate with the insulating bonding material interposed therebetween, an area contacting with the insulating bonding material is increased to improve the bonding strength between the electronic component (insulating base material substrate) and the insulating bonding material. In this configuration, the area of the first main surface is smaller than the area of the section, which is different from the area of the first main surface and is closest to the first main surface, among the sections parallel or substantially parallel to the first main surface. For this reason, the electronic component in which bonding reliability to the mounting substrate is improved without enlarging a mounting area of the electronic component including the insulating bonding material is obtained, and the electronic device including the mounting substrate on which the electronic component is mounted is obtained.

According to a preferred embodiment of the present invention, an electronic component manufacturing method includes providing a plurality of insulating base material layers; forming a coil conductor on at least one of the plurality of insulating base material layers; laminating the plurality of insulating base material layers; forming an insulating base material substrate by heating and pressurizing the plurality of laminated insulating base material layers after the conductor forming step; forming a mounting electrode on a first main surface of the insulating base material substrate; and forming a recess over an entire or substantially an entire periphery at an outer edge of the first main surface such that the entire or substantially the entire first main surface is disposed inside a section having a largest area among sections parallel or substantially parallel to the first main surface when viewed from a laminating direction after the base material forming step.

According to a preferred embodiment of the present invention, an electronic component manufacturing method includes providing a plurality of insulating base material layers; forming a coil conductor on at least one of the plurality of insulating base material layer; laminating the plurality of insulating base material layers; forming an insulating base material substrate by heating and pressurizing the plurality of laminated insulating base material layers after the conductor forming step; forming a mounting electrode on a first main surface of the insulating base material substrate; and separating the insulating base material substrate into individual pieces by grinding the insulating base material substrate from a first main surface side with a laser beam, such that an area of the first main surface is smaller than an area of a section, which is different from the first main surface in the area and closest to the first main surface, among sections parallel or substantially parallel to the first main surface, and such that the entire or substantially the entire first main surface is disposed inside a section having the largest area among the sections parallel or substantially parallel to the first main surface when viewed from a laminating direction.

The electronic component in which the sufficient bonding strength to the mounting substrate is secured in mounting the electronic component on the mounting substrate using the conductive bonding material and the insulating bonding material is easily manufactured by the above manufacturing methods.

In an electronic component manufacturing method according to a preferred embodiment of the present invention, preferably the insulating base material layer is made of a thermoplastic resin, and the base material forming step includes forming the insulating base material substrate by collectively pressing the plurality of laminated insulating base material layers.

According to the above manufacturing method, the insulating base material substrate is easily provided by collectively pressing the plurality of laminated insulating base material layers, so that the manufacturing time is reduced in the process of manufacturing the insulating base material substrate so as to reduce the cost to a low level In an electronic component manufacturing method according to a preferred embodiment of the present invention, the electrode forming step may include forming the mounting electrode on a surface of the insulating base material layer that becomes the first main surface of the insulating base material substrate before the base material forming step.

According to preferred embodiments of the present invention, the electronic components and the diaphragms in each of which the sufficient bonding strength to mounting substrates is easily secured in mounting the electronic component and the diaphragm on mounting substrates using the conductive bonding material and the insulating bonding material, and the electronic devices each including a mounting substrate on which the electronic components or the diaphragms are mounted are obtained. According to preferred embodiments of the present invention, the electronic components are easily manufactured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a sectional view illustrating a main portion of an electronic device 300 that is a comparative example.

FIG. 5 is a sectional view sequentially illustrating a process of manufacturing the electronic component 101.

FIG. 8 is a sectional view sequentially illustrating a process of manufacturing the electronic component 102.

DETAILED DESCRIPTION OF THE PREFERRED EMBODIMENTS

Figure 1A:
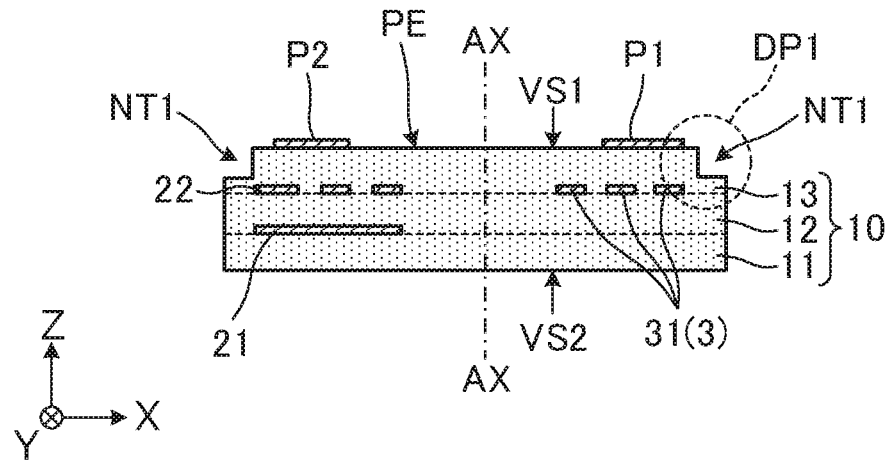
FIG. 1A is a sectional view of an electronic component 101 according to a first preferred embodiment of the present invention.

Hereinafter, a plurality of preferred embodiments of the present invention will be described with reference to the drawings and several specific examples. In each drawing, an identical component is denoted by an identical reference numeral. The preferred embodiments are separately illustrated in consideration of description of a main point or ease of understanding, but configurations of different preferred embodiments may partially be substituted or combined. In the second and subsequent preferred embodiments, the description of matter common to that of the first preferred embodiment is omitted, and only different points will be described. In particular, the same operations and advantageous effects with the same configuration will not successively be described in each preferred embodiment.

First Preferred Embodiment

Figure 1B:
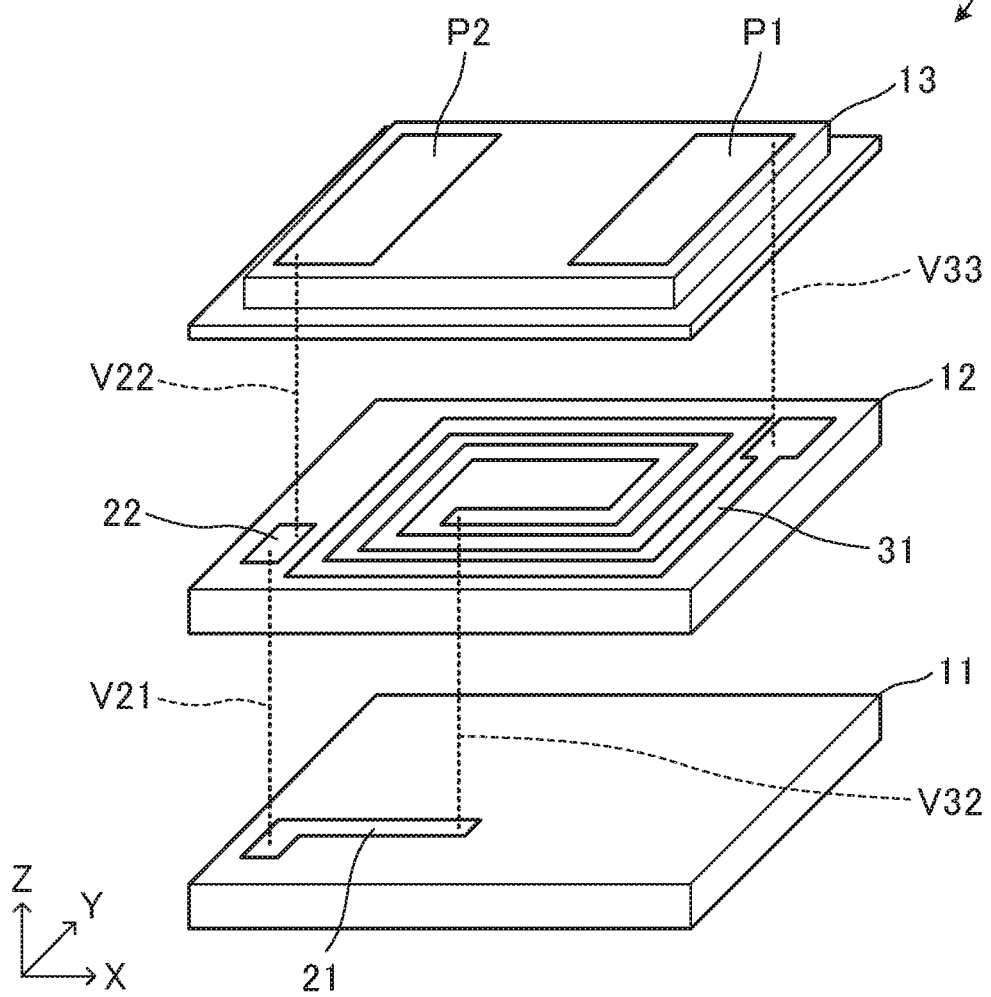
FIG. 1B is an exploded perspective view of the electronic component 101.
Figure 2A:
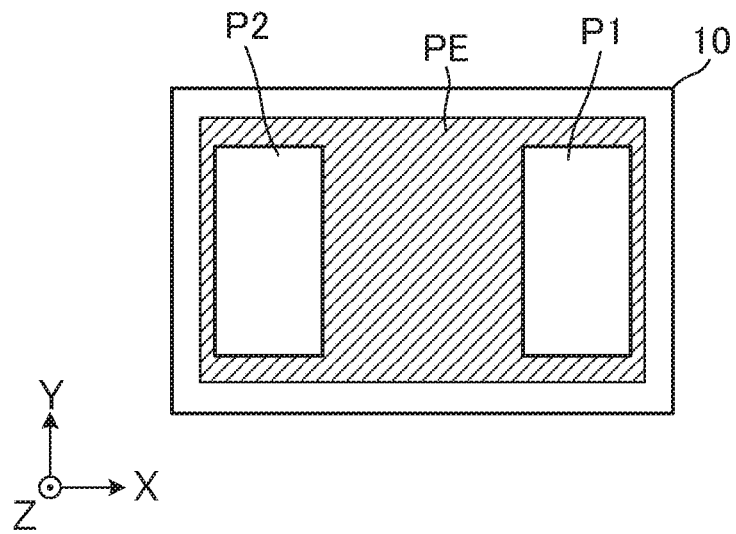
FIG. 2A is a plan view illustrating an electrode non-forming portion PE of the electronic component 101.
Figure 2B:
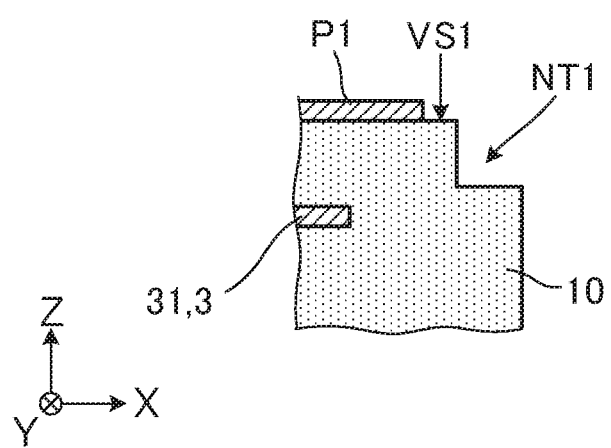
FIG. 2B is an enlarged view of a DP1 portion in FIG. 1A.

FIG. 1A is a sectional view of an electronic component 101 according to a first preferred embodiment of the present invention, and FIG. 1B is an exploded perspective view of the electronic component 101. FIG. 2A is a plan view illustrating an electrode non-forming portion PE of the electronic component 101, and FIG. 2B is an enlarged view of a DP1 portion in FIG. 1A. In FIG. 1A, a thickness of each component is illustrated in an exaggerated manner. The same holds true for sectional views in the following preferred embodiments. In FIG. 2A, the electrode non-forming portion PE is indicated by hatching in order to easily understand the structure.

The electronic components in preferred embodiments of the present invention are elements mounted on mounting substrates or other substrates using a conductive bonding material and an insulating bonding material. The electronic devices in preferred embodiments of the present invention are devices including the electronic components and the mounting substrates. Examples of the electronic devices include a cellular phone terminal, i.e., a smartphone, a tablet terminal, a notebook PC, a PDA, a wearable terminal (such as a smart watch or smart glasses), a camera, a game machine, and a toy.

The electronic component 101 includes an insulating base material substrate 10 including a first main surface VS1 and a second main surface VS2, a coil 3 (to be described in detail later) provided on the insulating base material substrate 10, and mounting electrodes P1, P2 provided on the first main surface VS1. In the first preferred embodiment, the first main surface VS1 of the insulating base material substrate 10 corresponds to the mounting surface, and the second main surface VS2 oppose to the first main surface VS1 corresponds to the top surface.

Preferably, the insulating base material substrate 10 is made of, for example, a thermoplastic resin having a rectangular or substantially rectangular parallelepiped shape in which a longitudinal direction corresponds to an X-axis direction. The insulating base material substrate 10 includes a recess NT1 provided over an entire or substantially an entire periphery at an outer edge of the first main surface VS1. As illustrated in FIG. 2B, a sectional shape of the recess NT1 is an L-shape. As illustrated in FIG. 2A, the electronic component 101 includes an electrode non-forming portion PE. The electrode non-forming portion PE is a portion in which the mounting electrodes P1, P2 are not provided in the first main surface VS1.

As illustrated in FIG. 1B, the insulating base material substrate 10 includes a plurality of insulating base material layers 11, 12, 13 that are laminated and made of the thermoplastic resin, for example. In each of the plurality of insulating base material layers 11, 12, 13, a planar shape is preferably a rectangular or substantially rectangular plate shape, and the longitudinal direction corresponds to the X-axis direction. For example, each of the plurality of insulating base material layers 11, 12, 13 is preferably a sheet mainly including a liquid crystal polymer (LCP).

A conductor 21 is provided on a surface of the insulating base material layer 11. The conductor 21 is disposed near a first corner (a lower left corner of the insulating base material layer 11 in FIG. 1B) of the insulating base material layer 11, and is an L-shaped conductor extending in the X-axis direction and a Y-axis direction. For example, the conductor 21 is a conductor pattern preferably made of a Cu foil.

A coil conductor 31 and a conductor 22 are provided on the surface of the insulating base material layer 12. The coil conductor 31 is preferably, for example, a rectangular or substantially rectangular spiral conductor including more than about 2-turn wound along an outer shape of the insulating base material layer 12. The conductor 22 is preferably, for example, a rectangular or substantially rectangular conductor disposed near the first corner (the lower left corner of the insulating base material layer 12 in FIG. 1B) of the insulating base material layer 12. For example, each of the coil conductor 31 and the conductor 22 is preferably a conductor pattern made of a Cu foil.

The two mounting electrodes P1, P2 are provided on the surface of the insulating base material layer 13. Each of the mounting electrodes P1, P2 is preferably, for example, a rectangular or substantially rectangular conductor in which the longitudinal direction is matched with the Y-axis direction. The mounting electrodes P1, P2 of the first preferred embodiment are disposed near a first side (a right side of the insulating base material layer 13 in FIG. 1B) of the insulating base material layer 13 and a second side (a left side of the insulating base material layer 13), respectively, and disposed along the X-axis direction. For example, each of the mounting electrodes P1, P2 is preferably a conductor pattern made of a Cu foil.

As illustrated in FIG. 1B, the mounting electrode P1 is connected to a first end of the coil conductor 31 through an interlayer connection conductor V33 provided on the insulating base material layer 13. A second end of the coil conductor 31 is connected to the first end of the conductor 21 through an interlayer connection conductor V32 provided on the insulating base material layer 12. The second end of the conductor 21 is connected to the mounting electrode P2 through the conductor 22 provided on the insulating base material layers 12, 13 and interlayer connection conductors V21, V22.

In this manner, the rectangular or substantially rectangular spiral coil 3 including more than about 2 turns is provided in the electronic component 101 and includes the coil conductor 31 provided on the insulating base material layer 12. As illustrated in FIG. 1A, the coil 3 is provided inside the insulating base material substrate 10, and both ends of the coil 3 are connected to the mounting electrodes P1, P2. As illustrated in FIG. 1A, the coil 3 includes a winding axis AX extending in a laminating direction (Z-axis direction) of the plurality of insulating base material layers 11, 12, 13.

In the first preferred embodiment, by way of example, the coil 3 includes the winding axis AX extending in the laminating direction (Z-axis direction) of the plurality of insulating base material layers 11, 12, 13. However, the winding axis AX of the coil 3 may not be exactly matched with the Z-axis direction. In preferred embodiments of the present invention, the term "including the winding axis extending in the laminating direction of the plurality of insulating base material layers" means that, for example, the winding axis AX of the coil 3 ranges from about −30° to about +30° with respect to the Z-axis direction.

In the electronic component 101, as illustrated in FIG. 1A, an area of the first main surface VS1 is smaller than an area of a section (for example, the interface between the insulating base material layers 12, 13), which is different from the first main surface VS1 in an area and is closest to the first main surface VS1, among sections (sections parallel to an XY-plane) parallel or substantially parallel to the first main surface VS1.

Figure 3:
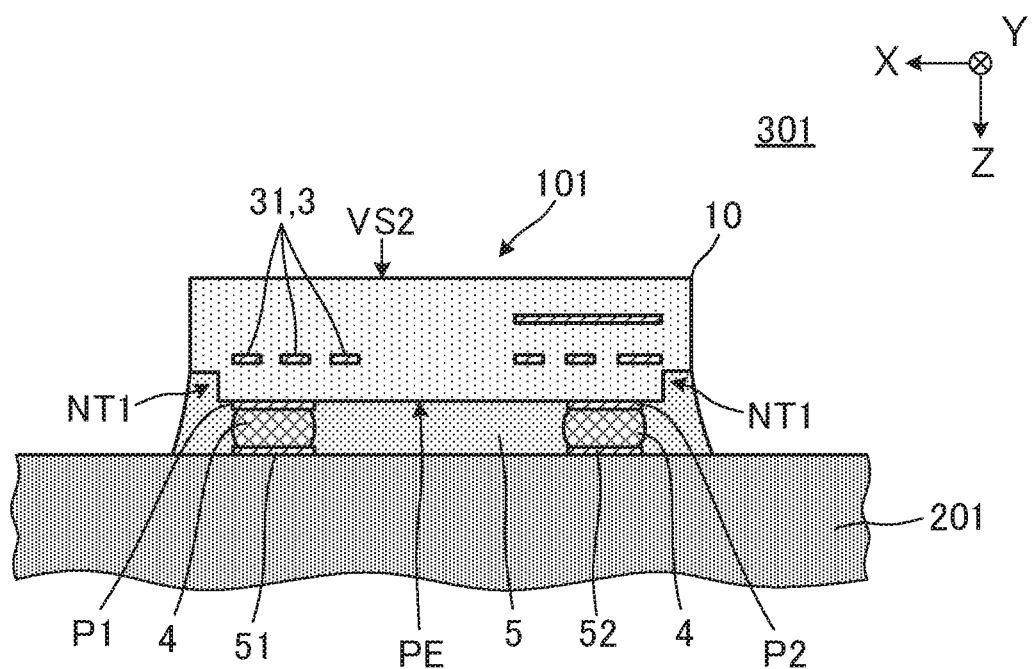
FIG. 3 is a sectional view illustrating a main portion of an electronic device 301 of the first preferred embodiment of the present invention.

A state in which the electronic component 101 is mounted on the mounting substrate using the conductive bonding material and the insulating bonding material will be described below with reference to FIG. 3. FIG. 3 is a sectional view illustrating a main portion of an electronic device 301 of the first preferred embodiment.

The electronic device 301 includes the electronic component 101 and a mounting substrate 201. For example, the mounting substrate 201 is a printed wiring board.

Conductors 51, 52 are provided on a main surface of the mounting substrate 201. The conductors 51, 52 are connected to the mounting electrodes P1, P2 with a conductive bonding material 4 interposed therebetween, respectively. The entire or substantially the entire electrode non-forming portion PE in FIG. 2A and the recess NT1 are bonded to the mounting substrate 201 with an insulating bonding material 5 interposed therebetween. For example, the conductive bonding material 4 is preferably solder. The insulating bonding material 5 is a bonding agent that is thermally hardened at a temperature equal or substantially equal to a melting temperature of the conductive bonding material 4. For example, the insulating bonding material 5 is preferably a bonding agent made of an epoxy thermosetting resin. For example, the insulating bonding material may be an underfill.

For example, the electronic component 101 of the first preferred embodiment is mounted on the mounting substrate 201 by the following non-limiting example of a process.

The paste conductive bonding material 4 is printed on the conductors 51, 52, and the insulating bonding material 5 is applied onto the mounting substrate 201 before thermally hardening, and then the electronic component 101 is mounted by a mounter such that the mounting electrodes P1, P2 are disposed on the conductors 51, 52, respectively. Subsequently, through a reflow process, the mounting electrodes P1, P2 are bonded to the conductors 51, 52 with the conductive bonding material 4 interposed therebetween, respectively, and the electrode non-forming portion PE and the recess NT1 are bonded to the mounting substrate 201 with the insulating bonding material 5 interposed therebetween. Depending on the temperature during the reflow process, the paste conductive bonding material 4 is melted and the mounting electrodes P1, P2 are connected to the conductors 51, 52, respectively. At the same time, the insulating bonding material 5 is thermally hardened, and the electrode non-forming portion PE and the recess NT1 are bonded to the mounting substrate 201.

An electronic device in which the electronic component not including the recess is mounted on the mounting substrate will be described below as a comparative example. FIG. 4 is a sectional view illustrating a main portion of an electronic device 300 that is a comparative example.

The electronic device 300 includes an electronic component 100 and the mounting substrate 201. The electronic component 100 is different from the electronic component 101 in that the electronic component 100 does not include the recess, and other configurations of the electronic component 100 are the same or substantially the same as those of the electronic component 101. In the electronic component 100, only an electrode non-forming portion PE0 is bonded to the mounting substrate 201 with the insulating bonding material 5 interposed therebetween. As illustrated in FIGS. 3 and 4, a mounting area of the electronic component 100 including the insulating bonding material 5 is identical or substantially identical to a mounting area of the electronic component 101 including the insulating bonding material 5.

On the other hand, in the electronic component 101, as illustrated in FIG. 3, the electrode non-forming portion PE and the recess NT1 are bonded to the mounting substrate 201 with the insulating bonding material 5 interposed therebetween. For this reason, as compared with the case in which only the electrode non-forming portion PE0 in FIG. 4 is bonded to the mounting substrate 201 with the insulating bonding material 5 interposed therebetween, an area contacting with the insulating bonding material 5 is increased to improve the bonding strength between the electronic component (insulating base material substrate) and the insulating bonding material 5.

According to the first preferred embodiment, the following effects are obtained.

In the electronic component 101 of the first preferred embodiment, the area of the first main surface VS1 is smaller than the area of the section, which is different from the first main surface VS1 in the area and is closest to the first main surface VS1, among the sections (the sections parallel to the XY-plane) parallel or substantially parallel to the first main surface VS1. The electronic component 101 includes the recess NT1 provided at the outer edge of the first main surface VS1, and the recess NT1 and the electrode non-forming portion PE are bonded to the mounting substrate 201 with the insulating bonding material 5 interposed therebetween. With this configuration, the bonding strength between the electronic component 101 (insulating base material substrate 10) and the insulating bonding material 5 is improved without enlarging a mounting area of the electronic component including the insulating bonding material 5, and the electronic component in which bonding reliability to the mounting substrate is improved is obtained. The electronic device including the mounting substrate on which the electronic component is mounted is obtained.

In the first preferred embodiment, the insulating bonding material 5 is the bonding agent that is thermally hardened at the temperature equal or substantially equal to the melting temperature of the conductive bonding material 4. With this configuration, a process of connecting the mounting electrodes P1, P2 to the conductors 51, 52 with the conductive bonding material 4 interposed therebetween, respectively, and a process of bonding the recess NT1 and the electrode non-forming portion PE to the mounting substrate 201 with the insulating bonding material 5 interposed therebetween is able to be simultaneously performed. Thus, a process of mounting the electronic component on the mounting substrate is simplified.

For example, the electronic component 101 of the first preferred embodiment is manufactured by the following non-limiting example of a process. FIG. 5 is a sectional view sequentially illustrating a process of manufacturing the electronic component 101.

As illustrated in a part (1) of FIG. 5, the conductor 21 is provided on the insulating base material layer 11 in a collective substrate state. Specifically, the metal foil (for example, a Cu foil) is laminated on one of the main surfaces of the insulating base material layer 11, and the metal foil is patterned by photolithography to form the conductor 21. For example, the insulating base material layer 11 is a thermoplastic resin sheet, such as a liquid crystal polymer.

Subsequently, the coil conductor 31 and the conductor 22 are provided on the insulating base material layer 12 in the collective substrate state. Specifically, the metal foil (for example, a Cu foil) is laminated on one of the main surfaces of the insulating base material layer 12, and the metal foil is patterned by photolithography to form the coil conductor 31 and the conductor 22. For example, the insulating base material layer 12 is a thermoplastic resin sheet, such as a liquid crystal polymer.

The process of forming the coil conductor on the insulating base material layer (at least one insulating base material layer among the plurality of insulating base material layers) is an example of the conductor forming step.

The mounting electrodes P1, P2 are provided on the surface (the surface of the insulating base material layer that becomes the first main surface VS1 after the insulating base material substrate 10 is provided) of the insulating base material layer 13 in the collective substrate state. Specifically, the metal foil (for example, a Cu foil) is laminated on one of the main surfaces of the insulating base material layer 13 in the collective substrate state, and the metal foil is patterned by photolithography to form the mounting electrodes P1, P2. Consequently, the electrode non-forming portion (PE) in which the mounting electrodes P1, P2 are not provided is provided on the surface of the insulating base material layer that becomes the first main surface VS1 after the formation of the insulating base material substrate 10. As described above, the electrode non-forming portion (PE) is a portion with which the insulating bonding material contacts while the electronic component is mounted on the mounting substrate. For example, the insulating base material layer 13 is a thermoplastic resin sheet, such as a liquid crystal polymer.

The process of forming the mounting electrode on the surface of the insulating base material layer that becomes the first main surface of the insulating base material substrate (at the same time, forming the electrode non-forming portion PE in which the mounting electrode is not provided in the surface of the insulating base material layer that becomes the first main surface of the insulating base material substrate) is an example of the electrode forming step.

The interlayer connection conductors (interlayer connection conductors V22, V23, V32, V33 in FIG. 1B) are provided in the plurality of insulating base material layers 11, 12, 13. After a through-hole is made by a laser beam, a conductive paste preferably including at least one of Cu, Ag, Sn, Ni, Mo or an alloy thereof, for example, is disposed, and hardened by heating and pressurization (the base material forming step), thus providing the interlayer connection conductor. For this reason, the interlayer connection conductor is made of a material having a melting point lower than a temperature at the heating and pressurization.

Subsequently, the insulating base material layers 11, 12, 13 are laminated in this order, and an insulating base material substrate 10B is provided by heating and pressurizing (collectively pressing) the plurality of laminated insulating base material layers 11, 12, 13.

The process of forming the insulating base material substrate by heating and pressurizing the plurality of laminated insulating base material layers after the conductor forming step is an example of the base material forming step.

After the above-described process, the insulating base material substrate 10B in the collective substrate state is separated into individual pieces (insulating base material substrate 10A) along a separation line DL in a part (2) of FIG. 5.

Subsequently, as illustrated in a part (3) of FIG. 5, the recess NT1 is provided by grinding a vicinity of an outer edge E1 of the first main surface VS1 of the insulating base material substrate 10A using a laser beam. Specifically, the recess NT1 is provided by grinding the vicinity of the outer edge E1 of the first main surface VS1 over the entire or substantially the entire circumference using a laser beam. Consequently, the electronic component 101 in a part (4) of FIG. 5 is obtained.

In the case in which the mounting substrate is mounted using the conductive bonding material and the insulating bonding material, the electronic component in which the bonding reliability to the mounting substrate is improved without increasing the mounting area of the electronic component including the insulating bonding material is able to be easily manufactured by the above-described manufacturing method.

In the first preferred embodiment, the insulating base material layer is made of a thermoplastic resin. According to the above-described manufacturing method, the insulating base material substrate 10A is able to be easily provided by collectively pressing the plurality of laminated insulating base material layers 11, 12, 13, so that the manufacturing time is reduced in the process of manufacturing the insulating base material substrate to reduce the cost to a low level.

In the first preferred embodiment, by way of example, the electrode forming step is performed before the base material forming step. However, the present invention is not limited to this configuration. The electrode forming step may be performed after the base material forming step. That is, in the electrode forming step, the mounting electrodes P1, P2 may be provided on the first main surface VS1 of the insulating base material substrate 10 after the base material forming step.

Second Preferred Embodiment

An example in which the shape of the insulating base material substrate is different from that of the first preferred embodiment will be described in a second preferred embodiment of the present invention.

Figure 6A:
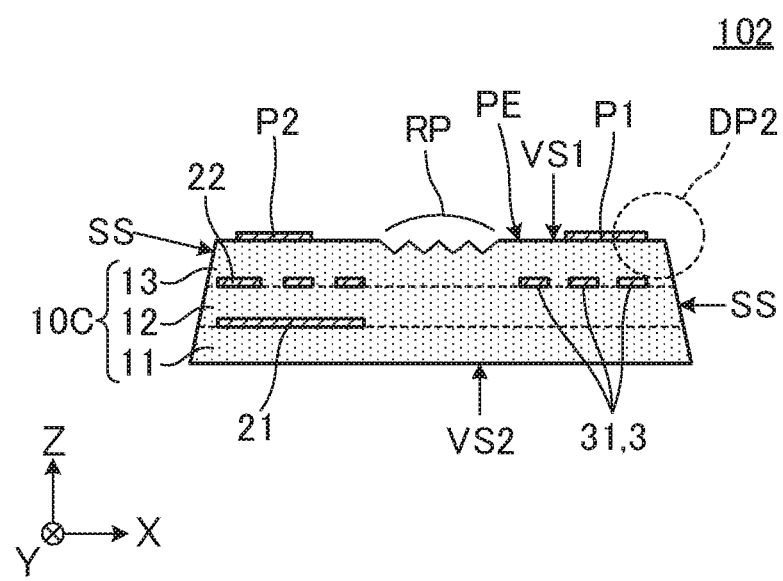
FIG. 6A is a sectional view of an electronic component 102 according to a second preferred embodiment of the present invention.
Figure 6B:
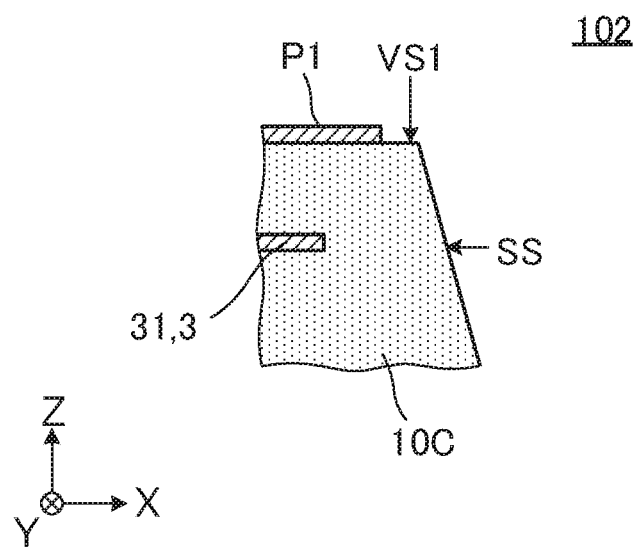
FIG. 6B is an enlarged view of a DP2 portion in FIG. 6A.

FIG. 6A is a sectional view of an electronic component 102 according to a second preferred embodiment, and FIG. 6B is an enlarged view of a DP2 portion in FIG. 6A.

The electronic component 102 is different from the electronic component 101 of the first preferred embodiment in the shape of the insulating base material substrate. Other configurations of the electronic component 102 are the same or substantially the same as those of the electronic component 101.

The electronic component 102 includes an insulating base material substrate 10C including the first main surface VS1, an end surface SS, and the second main surface VS2, the coil 3 provided on the insulating base material substrate 10C, the mounting electrodes P1, P2, and an uneven portion RP provided on the first main surface VS1. The end surface SS is a surface connected to the first main surface VS1.

The insulating base material substrate 10C is a thermoplastic-resin trapezoidal column in which the area of the first main surface VS1 is smaller than the area of the second main surface VS2. In other words, the insulating base material substrate 10C is provided into a tapered shape from the second main surface VS2 toward the first main surface VS1 (+Z direction). Consequently, in the electronic component 102, the area of the first main surface VS1 is smaller than the area of the section (for example, the section parallel or substantially parallel to the XY-plane in a −Z direction with respect to the first main surface VS1 in the insulating base material substrate 10C in FIG. 6A), which is different from the first main surface VS1 in the area and is closest to the first main surface VS1, among sections (sections parallel or substantially parallel to the XY-plane) parallel to the first main surface VS1.

The uneven portion RP is provided on the electrode non-forming portion PE (the portion in which the mounting electrodes P1, P2 are not provided in the first main surface VS1) of the electronic component 102. The uneven portion RP is a groove provided in the electrode non-forming portion PE by irradiation of a laser beam.

Figure 7:
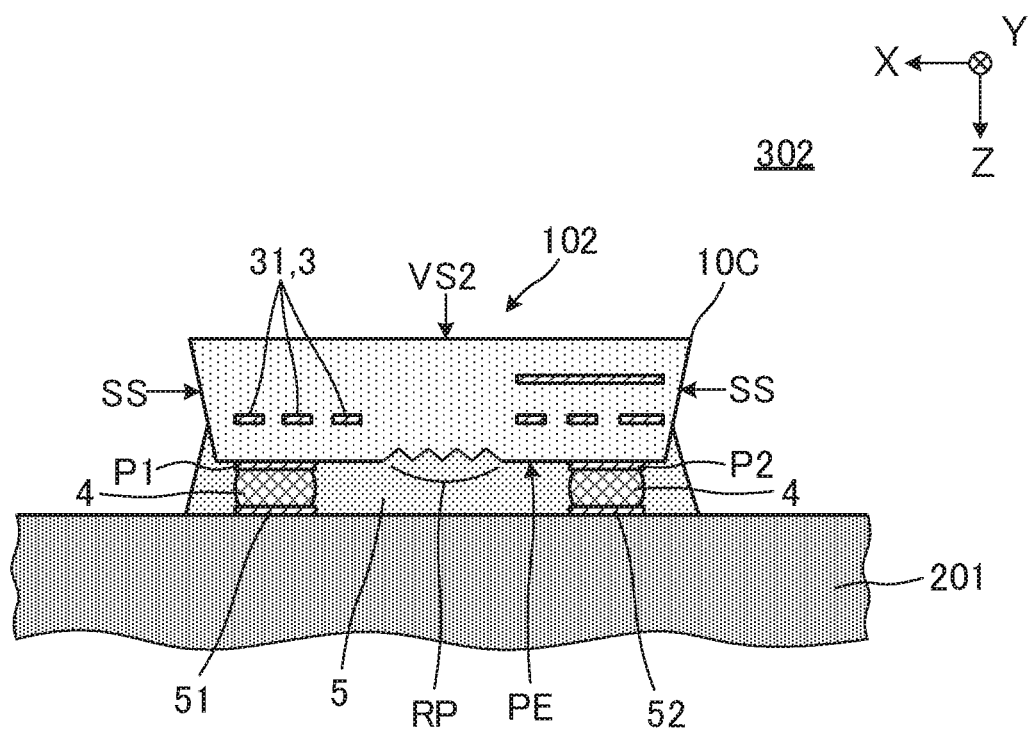
FIG. 7 is a sectional view illustrating a main portion of an electronic device 302 of the second preferred embodiment of the present invention.

The state in which the electronic component 102 is mounted on the mounting substrate using the conductive bonding material and the insulating bonding material will be described below with reference to FIG. 7. FIG. 7 is a sectional view illustrating a main portion of an electronic device 302 of the second preferred embodiment.

The electronic device 302 includes the electronic component 102 and a mounting substrate 201. The mounting substrate 201 is the same or substantially the same as that of the first preferred embodiment.

The conductors 51, 52 are connected to the mounting electrodes P1, P2 with a conductive bonding material 4 interposed therebetween, respectively. A portion of the end surface SS and the electrode non-forming portion PE are bonded to the mounting substrate 201 with the insulating bonding material 5 interposed therebetween.

According to the electronic component 102 of the second preferred embodiment, the following advantageous effects are obtained in addition to the advantageous effects of the first preferred embodiment.

The uneven portion RP provided in the electrode non-forming portion PE is provided in the second preferred embodiment. With this configuration, a surface area of the electrode non-forming portion PE that contacts with the insulating bonding material 5 while being mounted on the mounting substrate 201 is larger as compared with the case in which the uneven portion RP is not provided in the electrode non-forming portion PE, so that the bonding strength between the insulating base material substrate 10C and the insulating bonding material 5 is further improved.

As described in the second preferred embodiment, the shape of the insulating base material substrate may preferably be the trapezoidal column shape in which the area of the first main surface VS1 is smaller than the area of the second main surface VS2. The shape of the insulating base material substrate may be changed appropriately as long as the area of the first main surface VS1 is smaller than the area of the section, which is different from the first main surface VS1 in the area and is closest to the first main surface VS1, among the sections parallel or substantially parallel to the first main surface VS1.

For example, the electronic component 102 of the second preferred embodiment is manufactured by the following non-limiting example of a process. FIG. 8 is a sectional view sequentially illustrating a process of manufacturing the electronic component 102. The specific description of the same or substantially the same manufacturing process as described with reference to FIG. 5 will be omitted.

First, as illustrated in a part (1) of FIG. 8, the conductor 21 is provided on the insulating base material layer 11, the coil conductor 31 and the conductor 22 are provided on the insulating base material layer 12, and the mounting electrodes P1, P2 are provided on the insulating base material layer 13 (the conductor forming step and the electrode forming step).

Subsequently, the insulating base material layers 11, 12, 13 are laminated in this order, and the insulating base material substrate 10B is provided by heating and pressurizing the plurality of laminated insulating base material layers 11, 12, 13 (base material forming step).

Subsequently, as illustrated in a part (2) of FIG. 8, the insulating base material substrate 10B in the collective substrate state is separated into individual pieces (insulating base material substrate 10D) by grinding the insulating base material substrate 10B using a laser beam LR from the side of the first main surface VS1 of the insulating base material substrate 10B along the separation line DL. Through this process, the insulating base material substrate 10D is provided into a tapered shape from the second main surface VS2 toward the first main surface VS1 (+Z direction) as illustrated in a part (3) of FIG. 8.

The process of separating the insulating base material substrate into pieces by grinding the insulating base material substrate using the laser beam from the first main surface side after the base material forming step is an example of the separation step.

Subsequently, as illustrated in a part (3) of FIG. 8, the uneven portion RP is provided in the electrode non-forming portion PE. For example, the uneven portion RP is provided by irradiating the electrode non-forming portion PE using the laser beam from the side of the first main surface VS1. In a hole made by the laser beam, an area is reduced from the irradiation surface of the laser beam toward an opposite surface to the irradiation surface. Consequently, by using this, the taper is able to be provided by the simply irradiation of the laser beam.

Third Preferred Embodiment

An example in which the shape of the coil is different from that of the first and second preferred embodiments will be described in a third preferred embodiment of the present invention.

Figure 9A:
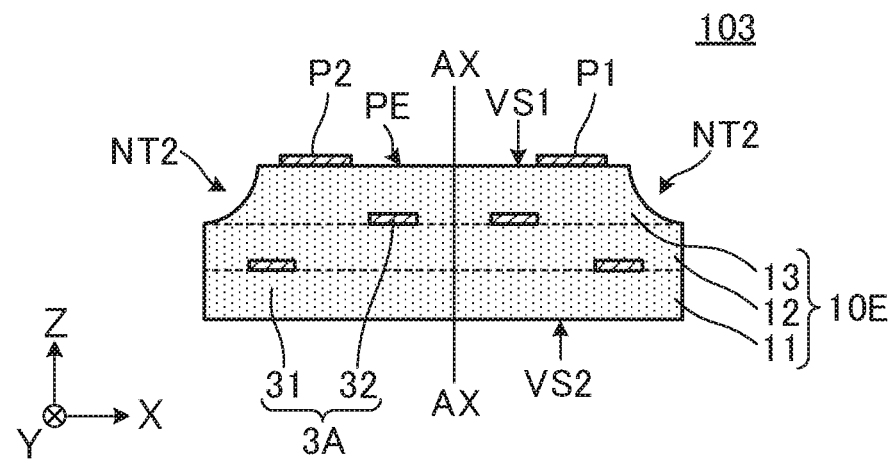
FIG. 9A is a sectional view of an electronic component 103 according to a third preferred embodiment of the present invention.
Figure 9B:
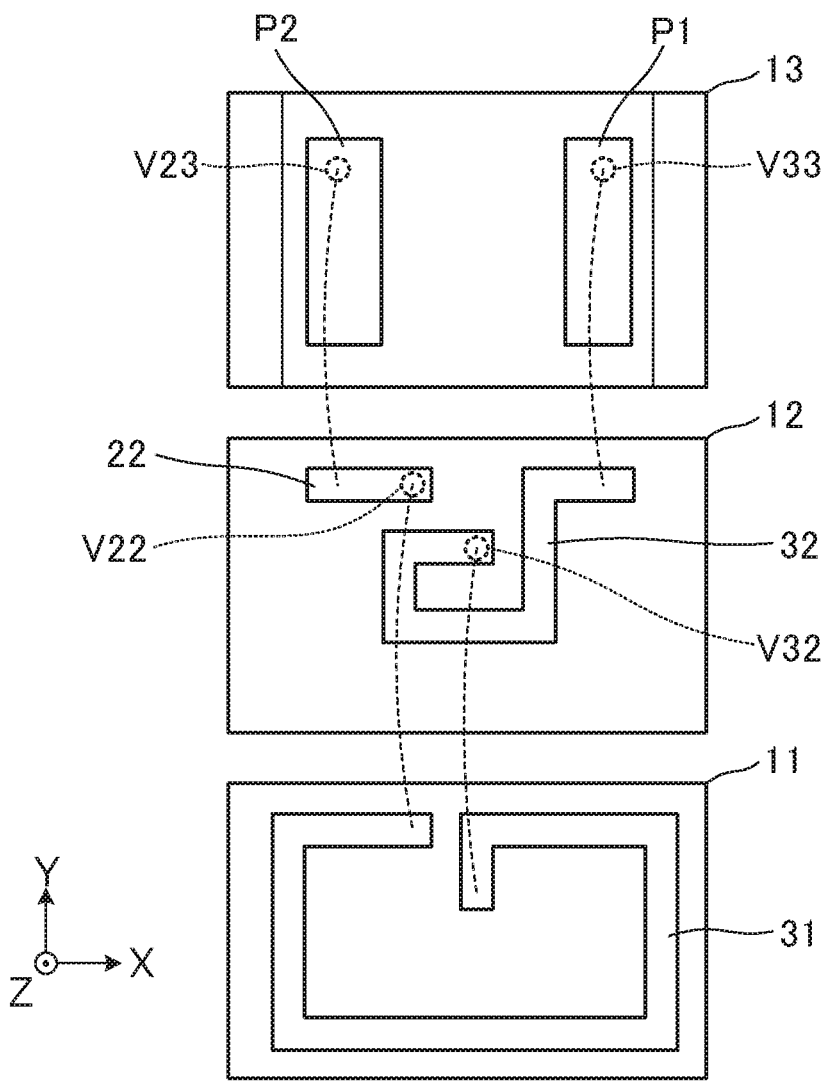
FIG. 9B is an exploded plan view of the electronic component 103.

FIG. 9A is a sectional view of an electronic component 103 according to a third preferred embodiment, and FIG. 9B is an exploded plan view of the electronic component 103.

The electronic component 103 is different from the electronic component 101 of the first preferred embodiment in the shape of the coil. The electronic component 103 is different from the electronic component 101 in the shape of the recess. Other configurations of the electronic component 103 are the same or substantially the same as those of the electronic component 101.

The electronic component 103 includes an insulating base material substrate 10E including the first main surface VS1 and the second main surface VS2, a coil 3A (to be described in detail later) provided on the insulating base material substrate 10E, and the mounting electrodes P1, P2.

As illustrated in FIGS. 9A and 9B, the insulating base material substrate 10E includes a recess NT2 provided at the outer edge of the first main surface VS1. The recess NT2 is provided near the first side (a right side of the insulating base material layer 13 in FIG. 9B) and the second side (a left side of the insulating base material layer 13 in FIG. 9B) of the first main surface VS1. The sectional shape of the recess NT2 is preferably a C-shape, for example.

As illustrated in FIG. 9B, the insulating base material substrate 10E is provided by sequentially laminating the plurality of insulating base material layers 11, 12, 13 made of the thermoplastic resin.

The coil conductor 31 is provided on the surface of the insulating base material layer 11. The coil conductor 31 is preferably, for example, a rectangular or substantially rectangular loop-shaped conductor having about 1 turn wound along the outer shape of the insulating base material layer 11.

A coil conductor 32 and the conductor 22 are provided on the surface of the insulating base material layer 12. The coil conductor 32 is preferably a rectangular or substantially rectangular loop-shaped conductor, which is disposed near a center of the insulating base material layer 12 and includes more than about 1 turn wound along the center or approximate center of the insulating base material layer 12. An outer diameter of the coil conductor 32 is smaller than an outer diameter of the coil conductor 31 provided on the insulating base material layer 11. The conductor 22 is an I-shaped conductor, which is disposed near a second corner (upper left corner of the insulating base material layer 12 in FIG. 9B) of the insulating base material layer 12 and extends in the X-axis direction.

The two mounting electrodes P1, P2 are provided on the surface of the insulating base material layer 13.

As illustrated in FIG. 9B, the mounting electrode P1 is connected to the first end of the coil conductor 32 through the interlayer connection conductor V33 provided on the insulating base material layer 13. The second end of the coil conductor 32 is connected to the first end of the coil conductor 31 through the interlayer connection conductor V32 provided on the insulating base material layer 12. The second end of the coil conductor 31 is connected to the first end of the conductor 22 through the interlayer connection conductor V22 provided on the insulating base material layer 12. The second end of the conductor 22 is connected to the mounting electrode P2 through the interlayer connection conductor V23 provided on the insulating base material layer 13.

In this manner, the rectangular or substantially rectangular spiral coil 3A including about 2 turns is provided in the electronic component 103 while including the coil conductors 31, 32 provided on at least two of the insulating base material layers 11, 12 among the plurality of insulating base material layers 11, 12, 13. Both ends of the coil 3A are connected to the mounting electrodes P1, P2.

As illustrated in FIG. 9A, the outer shape of the coil 3A according to the third preferred embodiment has an inverted conical shape with respect to the first main surface VS1 defining the mounting surface. Specifically, the coil conductor 32, which is closer to the first main surface VS1 of the plurality of coil conductors 31, 32, has an outer diameter smaller than that of the coil conductor 31 farther from the first main surface VS1, and has a line length shorter than that of the coil conductor 31. For this reason, a conductor area of the coil conductor 32 closer to the first main surface VS1 is smaller than that of the coil conductor 31 farther from the first main surface VS1.

Figure 10:
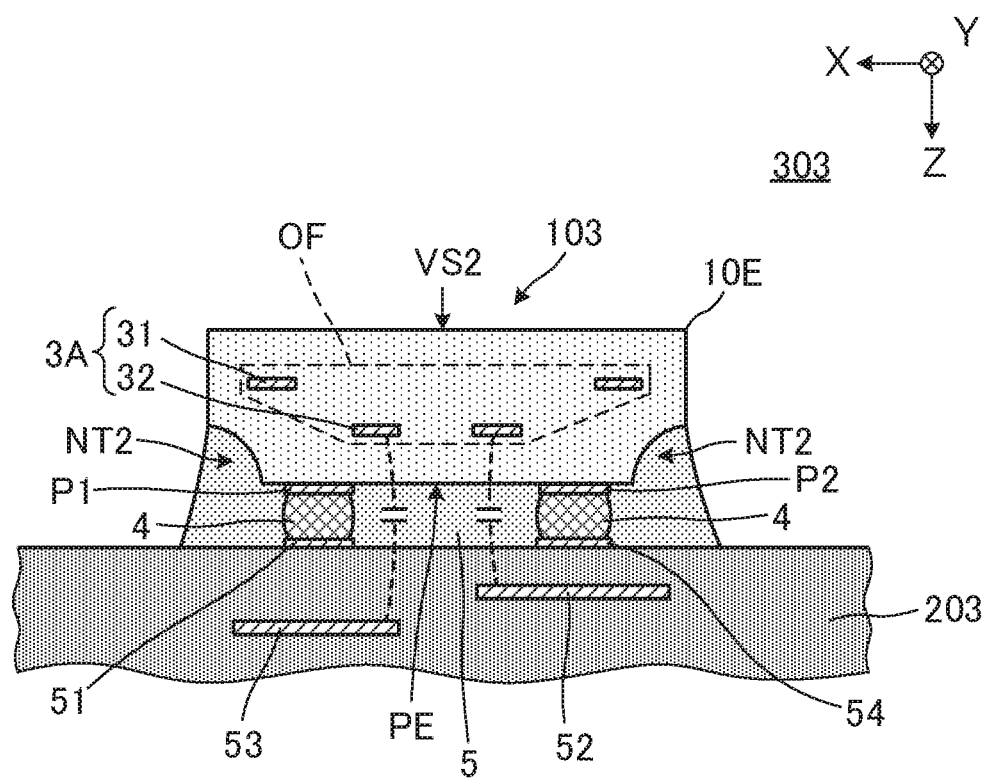
FIG. 10 is a sectional view illustrating a main portion of an electronic device 303 of the third preferred embodiment of the present invention.

The state in which the electronic component 103 is mounted on the mounting substrate using the conductive bonding material and the insulating bonding material will be described below with reference to FIG. 10. FIG. 10 is a sectional view illustrating a main portion of an electronic device 303 of the third preferred embodiment.

The electronic device 303 includes the electronic component 103 and a mounting substrate 203. For example, the mounting substrate 203 is preferably a multilayer substrate.

The mounting substrate 203 is different from the mounting substrate 201 of the first preferred embodiment in that the conductors 53, 54 are provided in the mounting substrate 203. The conductors 51, 52 are connected to the mounting electrodes P1, P2 with a conductive bonding material 4 interposed therebetween, respectively. The electrode non-forming portion PE and the recess NT2 of the electronic component 103 are bonded to the mounting substrate 203 with the insulating bonding material 5 interposed therebetween.

According to the electronic component 103 of the third preferred embodiment, the following advantageous effects are obtained in addition to the advantageous effects of the first preferred embodiment.

In the third preferred embodiment, the coil 3A includes the coil conductors 31, 32 provided on at least two insulating base material layers 11, 12, respectively. With this configuration, the electronic component including the coil having a predetermined number of windings and inductance is obtained.

In the third preferred embodiment, in the plurality of coil conductors 31, 32, the outer diameter and the line length of the coil conductor 32 closer to the first main surface VS1 are smaller than those of the coil conductor 31 farther from the first main surface VS1. In other words, the coil conductor 32 having a relatively small conductor area is disposed on the side of the first main surface VS1 defining the mounting surface. Thus, a stray capacitance (see a symbol of a capacitor in FIG. 10) generated between the conductors 53, 54 provided on the mounting substrate and the coil is prevented as compared with the case in which the electronic component in which the coil conductor 31 having the conductor area larger than that of the coil conductor 32 is disposed on the side of the first main surface VS1 is mounted on the mounting substrate.

A gap between the coil conductor 31 having the relatively large outer shape and line length and the conductor provided on the mounting substrate increases in the case in which the electronic component 103 having this configuration is mounted on the mounting substrate 203. Consequently, the increase in stray capacitance generated between the coil 3A and the conductor provided on the mounting substrate is prevented even if the insulating bonding material 5 having a dielectric constant higher than that of the insulating base material substrate is bonded (filled) to the recess NT2. With this configuration, the change in stray capacitance generated between the coil 3A and the conductor provided on the mounting substrate due to a variation in amount of the insulating bonding material 5 filled in the recess NT2 is decreased.

In the above-described configuration, the recess NT2 is provided at the outer edge of the first main surface VS1 along the outer shape of the coil (see an outline OF of the coil 3A in FIG. 10), so that there are few constraints by the outer shape of the coil (particularly the disposition of the coil conductor with respect to the insulating base material substrate) when forming the recess. Thus, with this configuration, a degree of freedom of design (such as a number, a depth, a shape, and a size) of the recess provided at the outer edge of the first main surface VS1 is increased.

Fourth Preferred Embodiment

A manufacturing method different from the electronic component manufacturing method of the first preferred embodiment will be described in a fourth preferred embodiment of the present invention.

Figure 11:
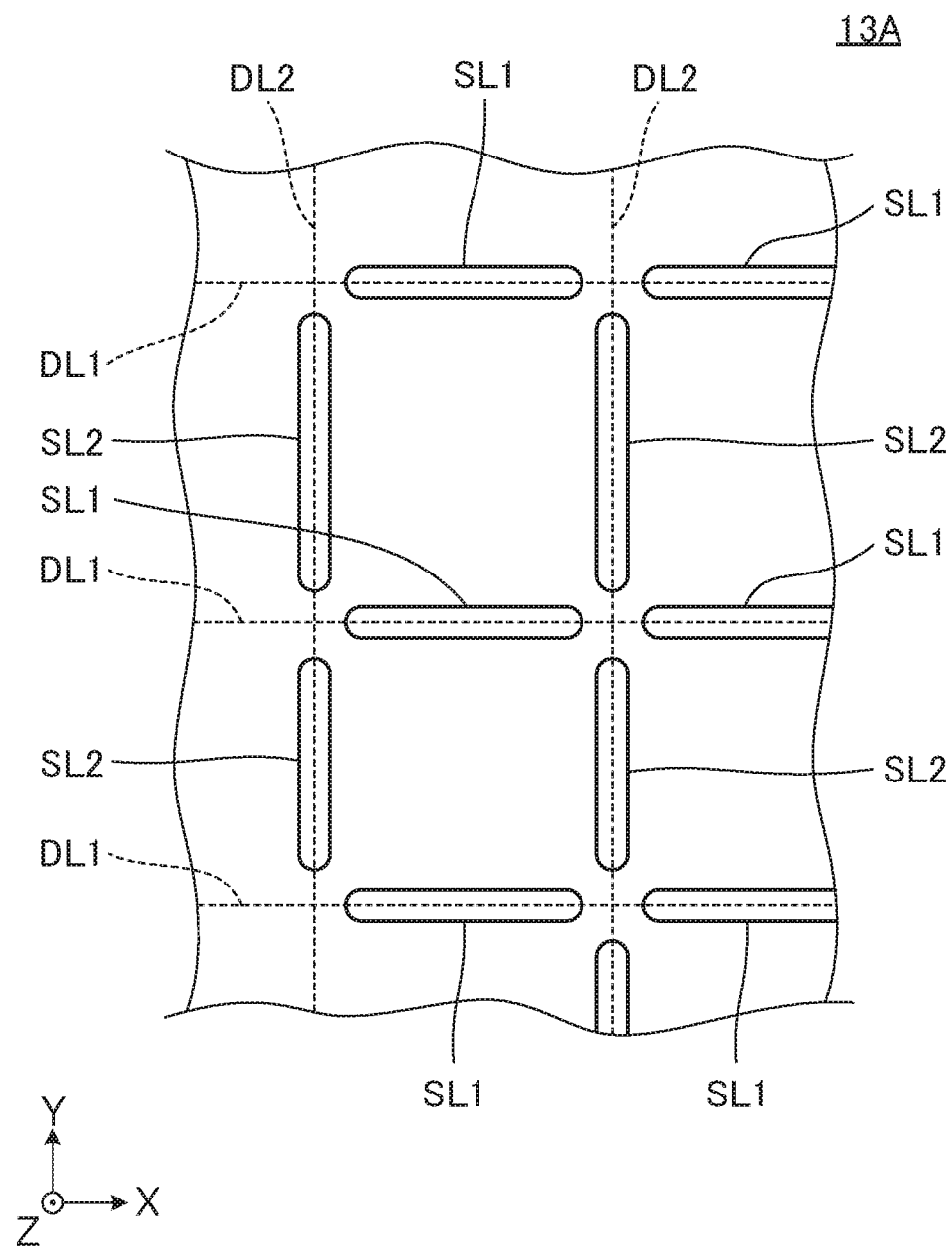
FIG. 11 is a plan view illustrating a main portion of an insulating base material layer 13A in a collective substrate state.

FIG. 11 is a plan view illustrating a main portion of an insulating base material layer 13A in a collective substrate state.

The surface of the insulating base material layer 13A in FIG. 11 is a surface that becomes the first main surface after the insulating base material substrate is provided. The insulating base material substrate of the fourth preferred embodiment is constructed by laminating the insulating base material layers 11, 12, 13A in FIG. 12 in this order, and by heating and pressurizing the plurality of laminated insulating base material layers 11, 12, 13A.

As illustrated in FIG. 11, holes SL1 and SL2 are made in the insulating base material layer 13A. The hole SL1 is a through-hole, which is made along a separation line DL1 (X-axis direction) to separate the insulating base material substrate in the collective substrate state into electronic components (individual pieces) after the base material forming step and extends to a back surface of the insulating base material layer 13A from the surface. The hole SL2 is a through-hole, which is made along a separation line DL2 (Y-axis direction) to separate the insulating base material substrate in the collective substrate state into electronic components (individual pieces) after the base material forming step and extends the back surface of the insulating base material layer 13A from the surface. For example, the holes SL1 and SL2 are made by grinding the insulating base material layer 13A using a laser beam.

Figure 12:
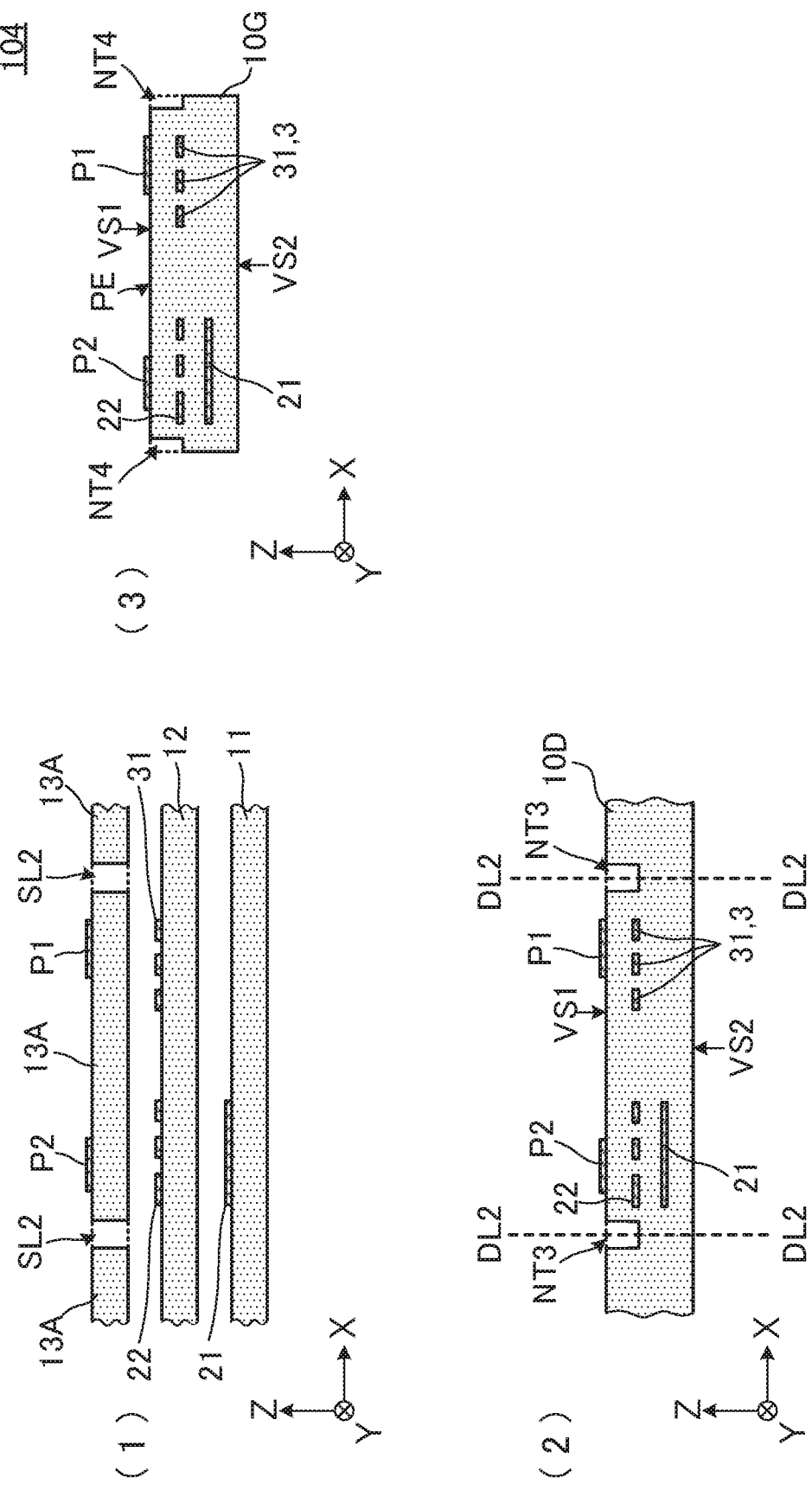
FIG. 12 is a sectional view sequentially illustrating a process of manufacturing an electronic component 104 according to a fourth preferred embodiment of the present invention.

The electronic component manufacturing method in which the insulating base material layer 13A is used will be described with reference to FIG. 12. FIG. 12 is a sectional view sequentially illustrating a process of manufacturing an electronic component 104 according to a fourth preferred embodiment. The description of the same manufacturing process as described with reference to FIGS. 5 and 8 will be omitted.

First, as illustrated in a part (1) of FIG. 12, the conductor 21 is provided on the insulating base material layer 11, the coil conductor 31 and the conductor 22 are provided on the insulating base material layer 12, and the mounting electrodes P1, P2 are provided on the insulating base material layer 13A (the conductor forming step and the electrode forming step). The holes (SL1, SL2) are made in the insulating base material layer 13A, and the holes (SL1, SL2) are not made in the insulating base material layers 11, 12.

Subsequently, the insulating base material layers 11, 12, 13A are laminated in this order, and the insulating base material substrate 10D is provided by heating and pressurizing the plurality of laminated insulating base material layers 11, 12, 13A (base material forming step). At this point, a recess NT3 is provided on the first main surface VS1 of the insulating base material substrate 10D.

After the above-described process, as illustrated in parts (2) and (3) of FIG. 12, the insulating base material substrate 10D in the collective substrate state is separated into pieces (electronic component 104) along a separation line DL2 (and the separation line DL1 in FIG. 11).

After the above-described process, the insulating base material substrate 10B in the collective substrate state is separated into individual pieces (insulating base material substrate 10A) along a separation line DL in a part (2) of FIG. 5.

As described above, a process of previously making a hole that become a recess later (after the base material forming step) in at least one insulating base material layer close to the first main surface of the plurality of insulating base material layers may be performed between the conductor forming step and the base material forming step.

In the fourth preferred embodiment, by way of example, the holes SL1 and SL2 are made only in the insulating base material layer 13A including the surface that becomes the first main surface of the insulating base material substrate. However, the present invention is not limited to this configuration. The holes SL1 and SL2 may be made in not only the insulating base material layer 13A but also the insulating base material layer 12. The holes are not made in the insulating base material layer 13A, but the holes may be made in the insulating base material layer 12. In this case, the insulating base material layer 11, the insulating base material layer 12 in which the hole is made, and the insulating base material layer 13A in which the hole is not made are heated and pressurized while laminated, wherein that the insulating base material layer 13A is deformed during the heating and the pressurization to form the groove (recess) in the first main surface of the insulating base material substrate. The holes SL1 and SL2 are not the through-holes, but may be grooves provided inward from the surface of the insulating base material layer 13A.

Fifth Preferred Embodiment

A diaphragm that vibrates by electromagnetic force will be described in a fifth preferred embodiment of the present invention.

Figure 13A:
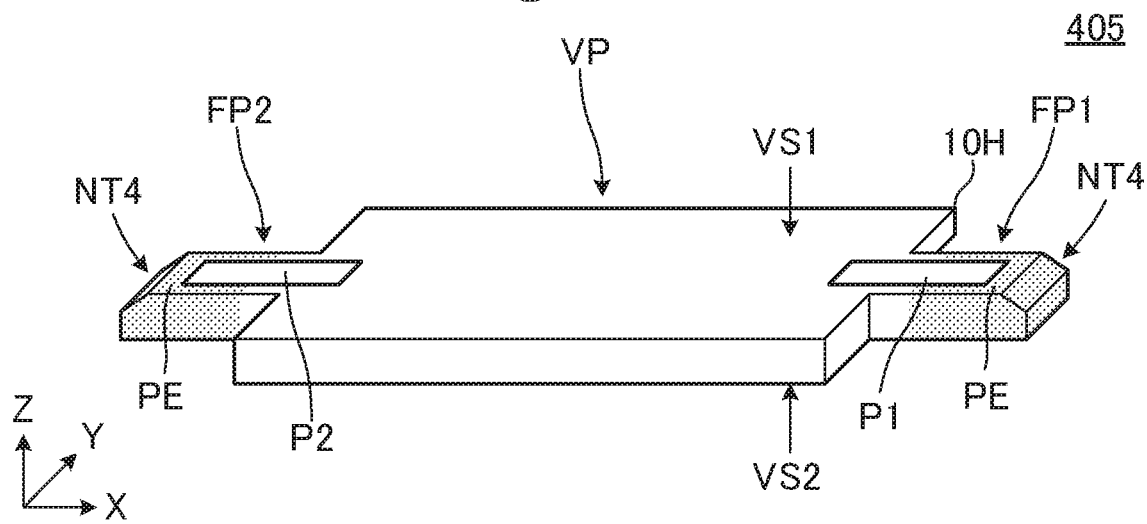
FIG. 13A is a perspective view of a diaphragm 405 according to a fifth preferred embodiment of the present invention.
Figure 13B:
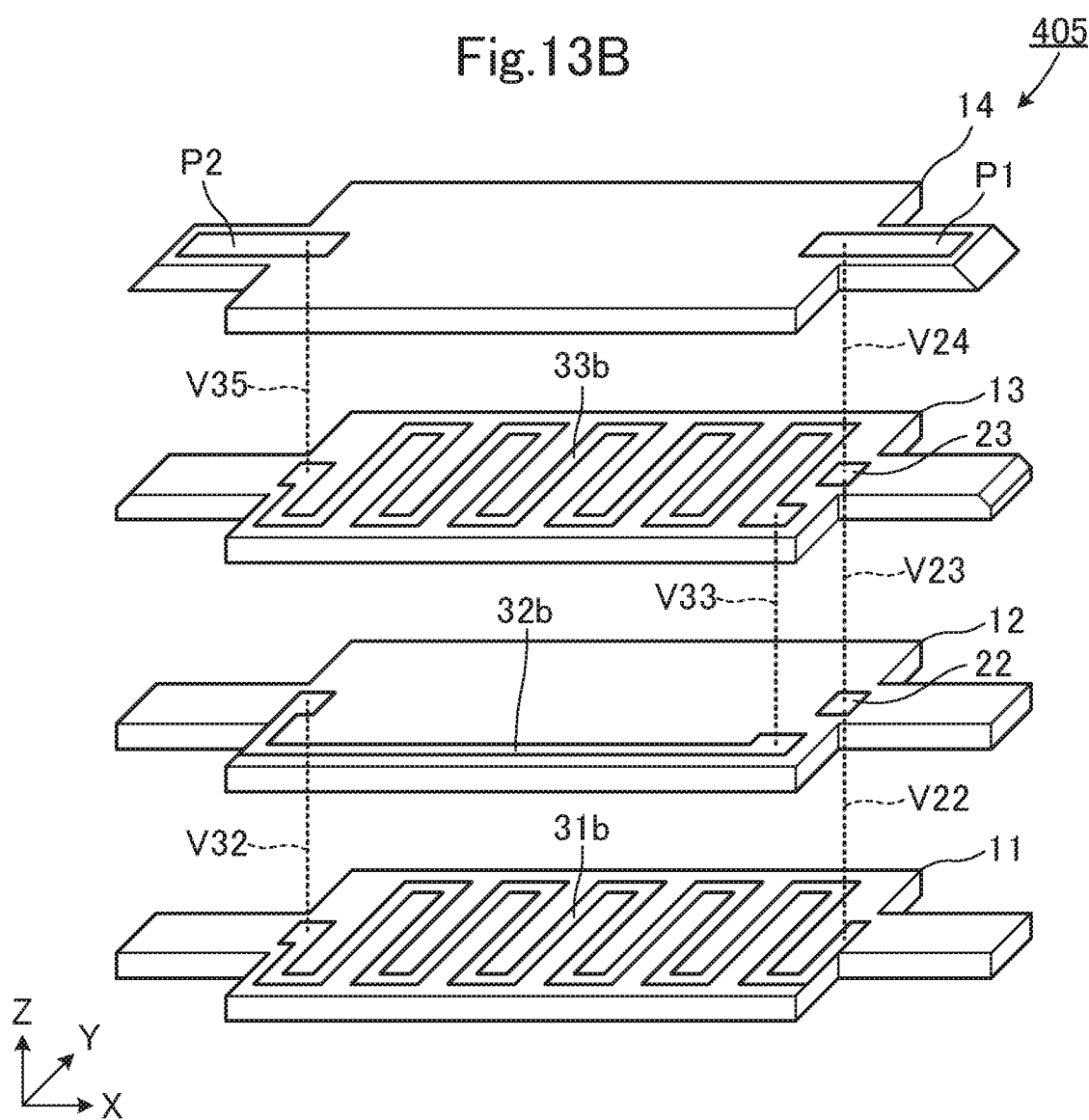
FIG. 13B is an exploded perspective view of the diaphragm 405.
Figure 14A:
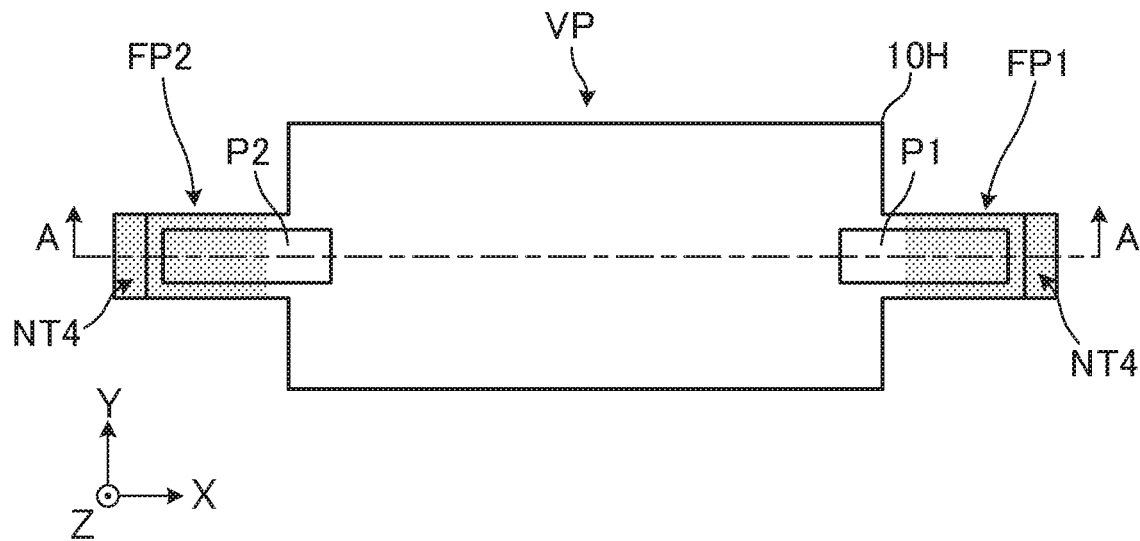
FIG. 14A is a plan view of the diaphragm 405.
Figure 14B:
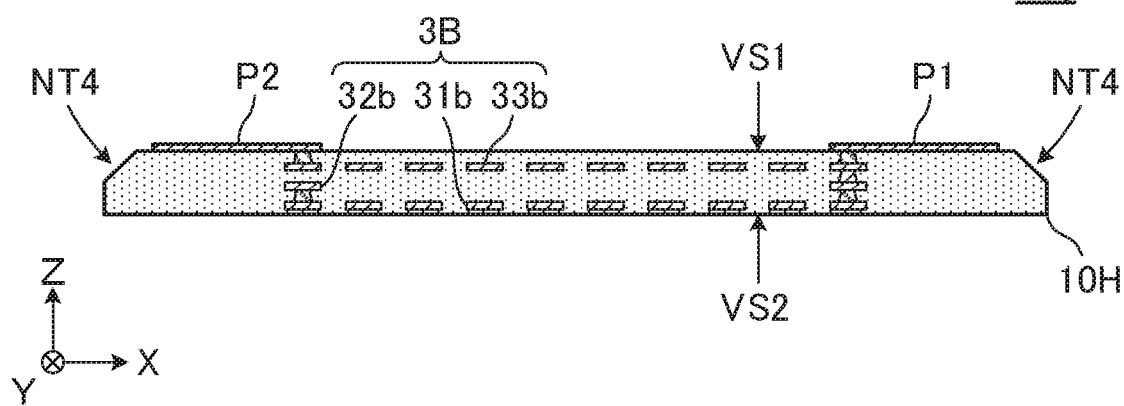
FIG. 14B is a sectional view taken along a line A-A in FIG. 14A.

FIG. 13A is a perspective view of a diaphragm 405 according to a fifth preferred embodiment, and FIG. 13B is an exploded perspective view of the diaphragm 405. FIG. 14A is a plan view of the diaphragm 405, and FIG. 14B is a sectional view taken along a line A-A in FIG. 14A. In FIGS. 13A and 14A, the supports FP1, FP2 are indicated by dot patterns in order to easily understand the structure.

The diaphragm 405 includes an insulating base material substrate 10H including the first main surface VS1 and the second main surface VS2 opposed to the first main surface VS1, a coil 3B (to be described in detail later) provided on the insulating base material substrate 10H, and the mounting electrodes P1, P2 provided on the first main surface VS1.

The insulating base material substrate 10H is made of a thermoplastic resin having a rectangular or substantially rectangular parallelepiped shape in which the longitudinal direction is matched with the X-axis direction. The insulating base material substrate 10H includes a vibrator VP that vibrates by the electromagnetic force and the supports FP1, FP2 fixed to another member (casing 70 described in detail later). The vibrator VP is located at the center or approximate center in the longitudinal direction of the insulating base material substrate 10H, and the supports FP1, FP2 are located at both ends in the longitudinal direction of the insulating base material substrate 10H. The support FP1, the vibrator VP, and the support FP2 are sequentially disposed along the X-axis direction.

As illustrated in FIGS. 13A and 14A, the widths in the Y-axis direction of the supports FP1, FP2 are narrower than the width in the Y-axis direction of the vibrator VP. The insulating base material substrate 10H includes a recess NT4 provided at the outer edge of each of the supports FP1, FP2 of the first main surface VS1. The recess NT4 is provided by grinding the vicinity at the outer edge of the first main surface VS1 of each of the supports FP1, FP2 using a laser beam.

As illustrated in FIG. 13B, the insulating base material substrate 10H is provided by sequentially laminating the plurality of insulating base material layers 11, 12, 13, 14 made of the thermoplastic resin. In each of the plurality of insulating base material layers 11, 12, 13, 14, a planar shape is a rectangular or substantially rectangular plate shape, and the longitudinal direction corresponds to the X-axis direction. For example, each of the insulating base material layers 11, 12, 13, 14 is preferably a sheet mainly including a liquid crystal polymer (LCP).

A coil conductor 31b is provided on the surface of the insulating base material layer 11. The coil conductor 31b is a meander-shaped conductor provided along the longitudinal direction of the insulating base material layer 11.

A coil conductor 32b and the conductor 22 are provided on the surface of the insulating base material layer 12. The coil conductor 32b is an L-shaped conductor provided along the outer periphery of the insulating base material layer 12. The conductor 22 is a rectangular or substantially rectangular conductor disposed closer to the first side (the right side of the insulating base material layer 12 in FIG. 13B) from the center of the insulating base material layer 12.

A coil conductor 33b and a conductor 23 are provided on the surface of the insulating base material layer 13. The coil conductor 33b is a meander-shaped conductor provided along the longitudinal direction of the insulating base material layer 13. The conductor 23 is a rectangular or substantially rectangular conductor disposed closer to the first side (the right side of the insulating base material layer 13 in FIG. 13B) from the center of the insulating base material layer 13.

The two mounting electrodes P1, P2 are provided on the surface of the insulating base material layer 14. The mounting electrode P1 is a linear conductor, which is disposed in the vicinity of the center of the first side (the right side of the insulating base material layer 14 in FIG. 13B) of the insulating base material layer 14 and extends along the longitudinal direction of the insulating base material layer 14. The mounting electrode P2 is a linear conductor, which is disposed in the vicinity of the center of the second side (the left side of the insulating base material layer 14 in FIG. 13B) of the insulating base material layer 14 and extends along the longitudinal direction of the insulating base material layer 14.

As illustrated in FIG. 13B, the mounting electrode P1 is connected to the first end of the coil conductor 31b through the conductors 22, 23 and the interlayer connection conductors V22, V23, V24, which are provided in the insulating base material layers 12, 13, 14. The second end of the coil conductor 31b is connected to the first end of the coil conductor 32b through the interlayer connection conductor V32 provided on the insulating base material layer 12. The second end of the coil conductor 32b is connected to the first end of the coil conductor 33b through the interlayer connection conductor V33 provided on the insulating base material layer 13. The second end of the coil conductor 33b is connected to the mounting electrode P2 through the interlayer connection conductor V35 provided in the insulating base material layer 14.

As described above, the coil 3B is provided in the diaphragm 405 and includes the coil conductors 31b, 32b, 33b and the interlayer connection conductors V32, V33, which are provided on the insulating base material layers 11, 12, 13. The coil 3B is provided in the insulating base material substrate 10H, and both ends of the coil 3B are connected to the mounting electrodes P1, P2.

The area of the first main surface VS1 is smaller than the area of the section (for example, the section parallel or substantially parallel to the XY-plane in a −Z direction with respect to the first main surface VS1 in the insulating base material substrate 10H in FIG. 14B), which is different from the first main surface VS1 in the area and is closest to the first main surface VS1, among sections (sections parallel or substantially parallel to the XY-plane) parallel to the first main surface VS1.

Figure 15A:
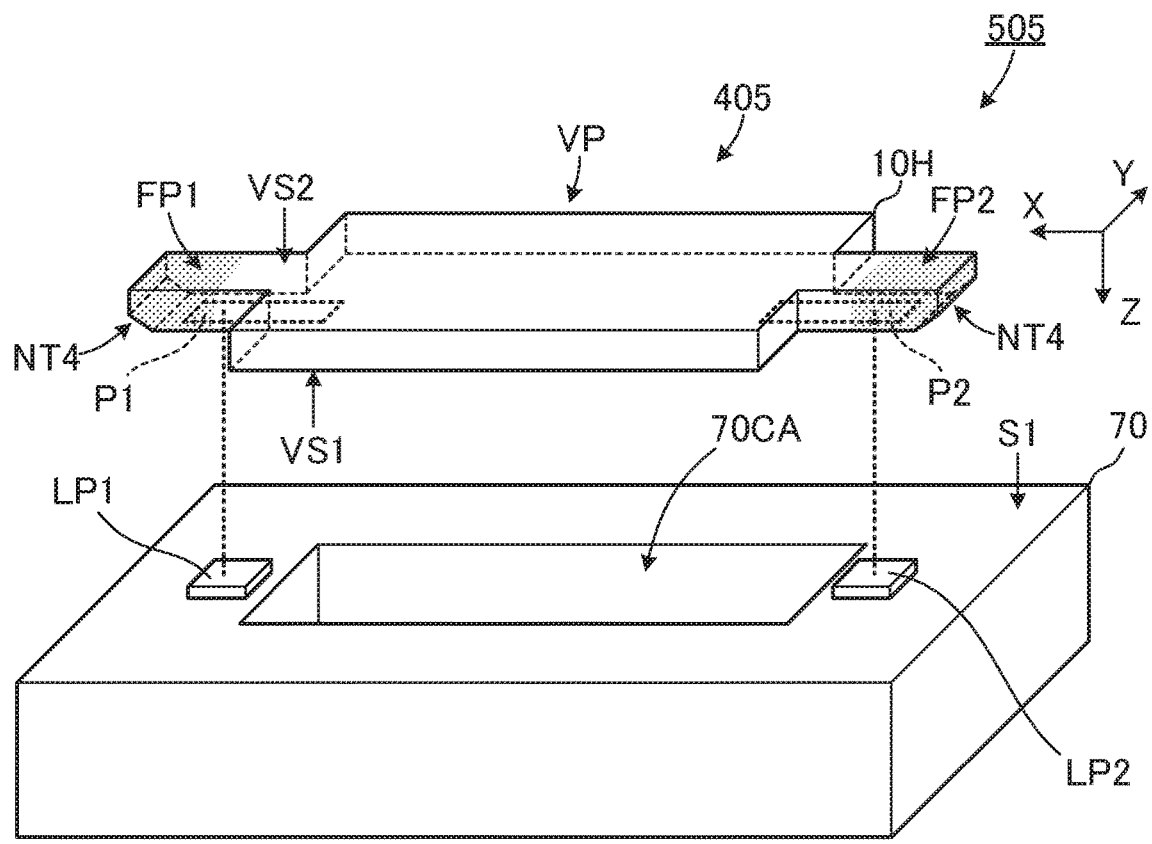
FIG. 15A is an exploded perspective view of a vibration device 505 of the fifth preferred embodiment of the present invention.

The electronic device including the diaphragm will be described below with reference to FIGS. 15A and 15B. FIG. 15A is an exploded perspective view of a vibration device 505 of the fifth preferred embodiment, and FIG. 15B is a sectional view of the vibration device 505.

The vibration device 505 includes a diaphragm 405 and the casing 70. A recess 70CA and connection conductor patterns LP1, LP2 are provided on a first surface S1 of the casing 70. A plurality of magnets 8 are provided in the recess 70CA.

Figure 15B:
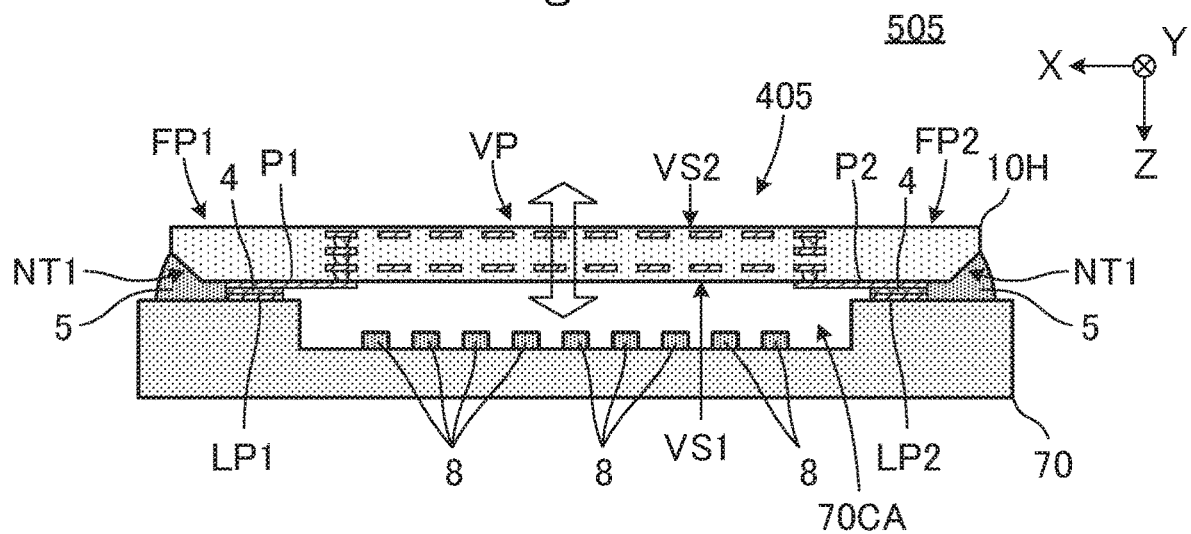
FIG. 15B is a sectional view of the vibration device 505.

As illustrated in FIGS. 15A and 15B, the diaphragm 405 is disposed on the casing 70 while the side of the first main surface VS1 of the diaphragm 405 is oriented toward the side of the first surface S1 of the casing 70, a support of the diaphragm 405 is bonded to a top surface of the casing 70. Specifically, the mounting electrode P1 is connected to the connection conductor pattern LP1 with the conductive bonding material 4 interposed therebetween. The mounting electrode P2 is connected to the connection conductor pattern LP2 with the conductive bonding material 4 interposed therebetween. Further, the bonding portion of the diaphragm 405 (the sides of the first main surface VS1 of the supports FP1, FP2 and the recess NT4) is connected to the first surface S1 of the casing 70 with the insulating bonding material 5 interposed therebetween.

In the fifth preferred embodiment, an elastic modulus (for example, solder (Sn-3Ag-0.5Cu) having an elastic modulus of about 41.6 GPa) of the conductive bonding material 4 is higher than an elastic modulus (for example, about 20 GPa to about 25 GPa) of the insulating bonding material 5 or an elastic modulus (for example, the LCP insulating base material substrate having an elasticity modulus of about 12 GPa to about 14 GPa) of the insulating base material substrate 10H. The use of the insulating bonding material 5 having an intermediate elastic modulus between the conductive bonding material and the insulating base material substrate is unlikely to peel off the diaphragm from another member as described in detail later.

The plurality of magnets 8 are disposed between conductor patterns of the coil conductors 31b, 33b such that an S pole and an N pole are alternately opposed to each other. The casing 70 includes terminals (not illustrated) electrically connected to the connection conductor patterns LP1, LP2. The terminal is connected to a circuit of the electronic device when incorporating a vibration device 508 of the fifth preferred embodiment in the electronic device. A driving current is passed through the coil conductors 31b, 32b, 33b of the diaphragm 405 through the connection conductor patterns LP1, LP2, such that the vibrator VP of the diaphragm 405 vibrates in the direction indicated by an outlined arrow in FIG. 15B.

Figure 16:
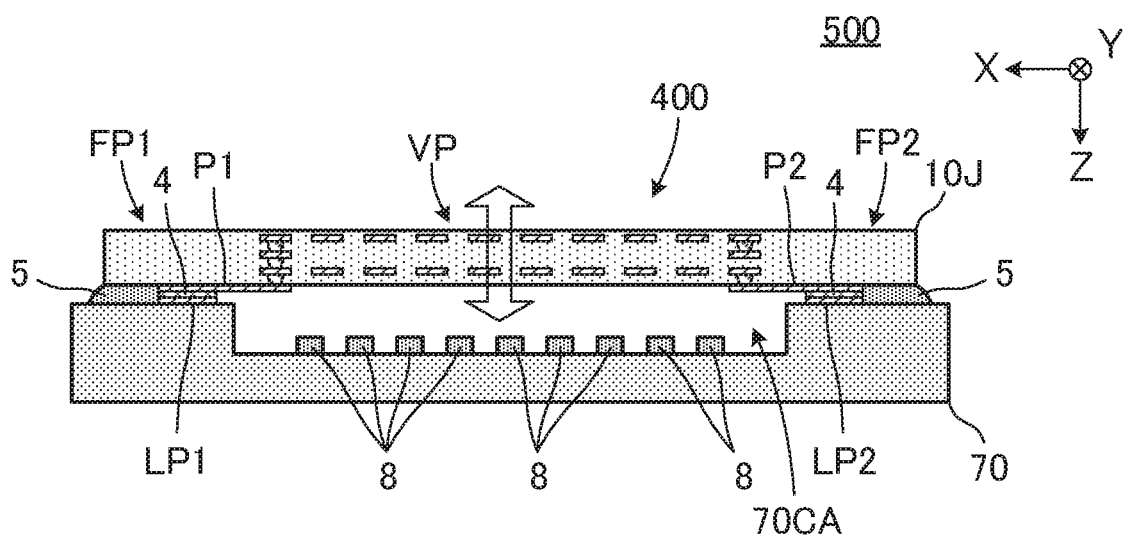
FIG. 16 is a sectional view of a vibration device 500 that is a comparative example.

A vibration device in which a diaphragm that does not include the recess is fixed to the casing will be described below as a comparative example. FIG. 16 is a sectional view of a vibration device 500 that is a comparative example.

A vibration device 500 includes a diaphragm 400 and the casing 70. The diaphragm 400 is different from the diaphragm 405 in that the diaphragm 400 does not include the recess, and the other configurations are the same or substantially the same as those of the diaphragm 405. In the diaphragm 400, only the sides of the first main surface VS1 of the supports FP1, FP2 are bonded to the casing 70 with the insulating bonding material 5 interposed therebetween.

On the other hand, in the diaphragm 405, as illustrated in FIG. 15B, the sides of the first main surface VS1 of the supports FP1, FP2 and the recess NT4 are bonded to the casing 70 with the insulating bonding material 5 interposed therebetween. For this reason, as compared with the case in which only the sides of the first main surface VS1 of the supports FP1, FP2 in FIG. 16 are bonded to the casing 70 with the insulating bonding material 5 interposed therebetween, the area contacting with the insulating bonding material 5 is increased to improve the bonding strength between the diaphragm (insulating base material substrate) and the insulating bonding material 5.

According to the fifth preferred embodiment, the following effects are obtained.

When the diaphragm 405 vibrates repeatedly, the stress is generated at the interface between the supports FP1, FP2 of the insulating base material substrate 10H and the casing 70, and peeling is easily generated at the interface between the insulating base material substrate 10H and the insulating bonding material 5. In the fifth preferred embodiment, not only the sides of the first main surface VS1 of the supports FP1, FP2 but also the recess NT4 are bonded to the casing 70 with the insulating bonding material 5 interposed therebetween. For this reason, as compared with the case in which only the sides of the first main surface VS1 of the supports FP1, FP2 are bonded to the casing 70 with the insulating bonding material 5 interposed therebetween, the surface area of the bonding portion (the portion in which the insulating base material substrate 10H and the insulating bonding material 5 contact with each other) is increased to improve the bonding strength between the insulating base material substrate 10H and the insulating bonding material 5. Thus, with this configuration, the diaphragm in which peeling of the interface between the insulating base material substrate 10H and the insulating bonding material 5 is prevented is obtained.

When the diaphragm vibrates, the stress is applied to the bonding portions of the supports FP1, FP2. In the case in which the diaphragm is bonded to another member (casing 70) only with the conductive bonding material 4, there is a large difference in physical property between the insulating base material substrate and the conductive bonding material (the insulating base material substrate is greatly different from conductive bonding material in the elastic modulus), so that the stress is concentrated on the interface between the mounting electrodes P1, P2 of the diaphragm and the conductive bonding material during the vibration to easily peel off the diaphragm from another member. On the other hand, in the fifth preferred embodiment, the insulating bonding material 5 having the intermediate elastic modulus between the conductive bonding material and the insulating base material substrate is used to bond the diaphragm to another member, which enables dispersion of the stress applied to the interface between the mounting electrodes P1, P2 of the diaphragm and the conductive bonding material 4. Consequently, with this configuration, the peeling of the diaphragm from another member is prevented during the vibration.

In the fifth preferred embodiment, the widths in the Y-axis direction of the supports FP1, FP2 are narrower than the width in the Y-axis direction of the vibrator VP. With this configuration, flexibility of the supports FP1, FP2 is improved, and the vibrator VP vibrates easily by the electromagnetic force, so that the diaphragm having the large amplitude is obtained. The bonding strength between the insulating base material substrate and the insulating bonding material 5 may not sufficiently ensured in the case in which the widths of the supports FP1, FP2 are narrower than the width of the vibrator VP. However, the sides of the first main surface VS1 of the supports FP1, FP2 and the recess NT4 are bonded to the casing 70 with the insulating bonding material 5 interposed therebetween, so that the surface area of the portion in which the insulating base material substrate and the insulating bonding material 5 contact with each other is increased to improve the bonding strength between the insulating base material substrate and the insulating bonding material 5.

In the fifth preferred embodiment, the insulating base material substrate 10H is provided by laminating a plurality of insulating base material layers 11, 12, 13, 14 in this order, so that the strength of the supports FP1, FP2 is secured as compared with a smaller number of insulating base material layers.

In the fifth preferred embodiment, the coil conductors 31b, 32b, 33b provided on the plurality of insulating base material layers 11, 12, 13, respectively, are provided, so that the compact diaphragm having the strong electromagnetic force is obtained. The coil conductors 31b, 33b overlap each other when viewed from the Z-axis direction, so that the coil conductor contributing to the electromagnetic force has high density of a current path.

In the fifth preferred embodiment, the insulating base material substrate 10H in which the recess NT4 is provided at the outer edge of each of the supports FP1, FP2 in the first main surface VS1. However, the present invention is not limited to this configuration. The above advantageous effects are obtained when the area of the first main surface VS1 is smaller than the area of the section, which is different from the area of the first main surface VS1 and is closest to the first main surface VS1, among the sections parallel or substantially parallel to the first main surface VS1 (the section of the XY-plane). That is, the outer edge of the support of the insulating base material substrate may be tapered toward the first main surface VS1 (toward the +Z direction) from the second main surface VS2 of the insulating base material substrate.

In the fifth preferred embodiment, the insulating base material substrate 10H includes the two supports FP1, FP2. However, the present invention is not limited to this configuration. The number of supports may be appropriately changed within a range in which the action and advantageous effects of preferred embodiments of the present invention are exerted, and may be one or at least three, for example.

Sixth Preferred Embodiment

An example of a diaphragm including four supports will be illustrated in a sixth preferred embodiment of the present invention.

Figure 17:
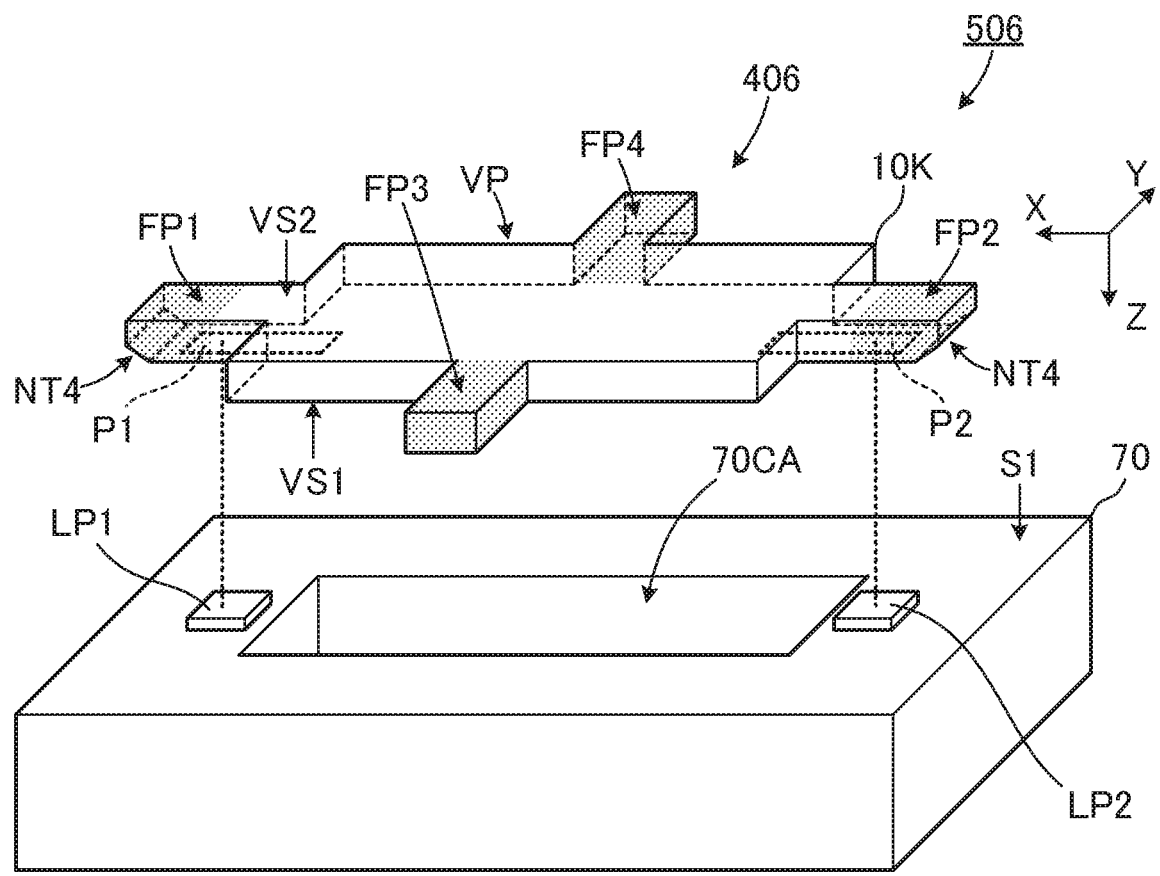
FIG. 17 is an exploded perspective view of a vibration device 506 according to a sixth preferred embodiment of the present invention.

FIG. 17 is an exploded perspective view of a vibration device 506 according to a sixth preferred embodiment. In FIG. 17, supports FP1, FP2, FP3, FP4 are indicated by dot patterns in order to easily understand the structure.

The vibration device 506 includes a diaphragm 406 and the casing 70. The diaphragm 406 includes an insulating base material substrate 10K including the first main surface VS1, a coil (not illustrated) provided on the insulating base material substrate 10K, and mounting electrodes provided on the first main surface VS1.

The insulating base material substrate 10K is different from the insulating base material substrate 10H of the fifth preferred embodiment in that the insulating base material substrate 10K further includes supports FP3, FP4 fixed to another member (casing 70). The other configurations are the same or substantially the same as those of the insulating base material substrate 10H.

Portions different from the diaphragm 405 and the vibration device 505 of the fifth preferred embodiment will be described below.

The supports FP3, FP4 are located at both ends of the insulating base material substrate 10K in a transverse direction (Y-axis direction). The support FP3, the vibrator VP, and the support FP4 are disposed in order along the Y-axis direction. As illustrated in FIG. 17, the widths in the X-axis direction of the supports FP3, FP4 are narrower than the width in the X-axis direction of the vibrator VP.

As illustrated in FIG. 17, the diaphragm 406 is disposed on the casing 70 while the sides of the first main surface VS1 is oriented toward the side of the first surface S1 of the casing 70, and the supports FP1, FP2, FP3, FP4 of the diaphragm 406 are bonded to the top surface of the casing 70. The bonding portion (the sides on the first main surface VS1 of the supports FP1, FP2, FP3, FP4 and the recess NT4) of the diaphragm 406 is connected to the first surface S1 of the casing 70 with the insulating bonding material 5 interposed therebetween.

According to the vibration device 506 of the sixth preferred embodiment, the following advantageous effects are obtained in addition to the advantageous effects of the fifth preferred embodiment.

The insulating base material substrate 10K of the sixth preferred embodiment includes the supports FP3, FP4 located at both ends in the transverse direction (Y-axis direction) of the insulating base material substrate 10K in addition to the supports FP1, FP2 located at both ends in the longitudinal direction (X-axis direction) of the insulating base material substrate 10K. With this configuration, when the diaphragm 405 vibrates, twisting of the insulating base material substrate 10K (for example, a twist about the X-axis direction) is prevented, and a vibration characteristic of the diaphragm is further stabilized.

In the sixth preferred embodiment, by way of example, the recess NT4 is provided only in the supports (supports FP1, FP2) in which the mounting electrodes P1, P2 are provided on the first main surface VS1. However, the present invention is not limited to this configuration. The recesses do not need to be provided in all the supports, but may be provided in the support (supports FP3, FP4 in the sixth preferred embodiment) in which the mounting electrode is not provided on the first main surface VS1. The outer edge of the support (supports FP3, FP4) in which the mounting electrode is not provided is tapered from the second main surface VS2 of the insulating base material substrate toward the first main surface VS1 (toward the +Z direction).

Seventh Preferred Embodiment

An example of a diaphragm including an electronic component and a support film will be illustrated in a seventh preferred embodiment of the present invention.

Figure 18A:
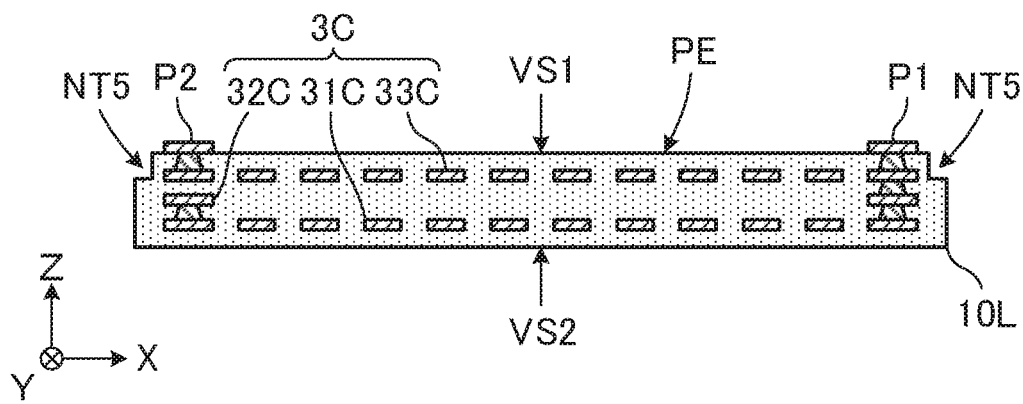
FIG. 18A is a sectional view of an electronic component 107 according to a seventh preferred embodiment of the present invention.
Figure 18B:
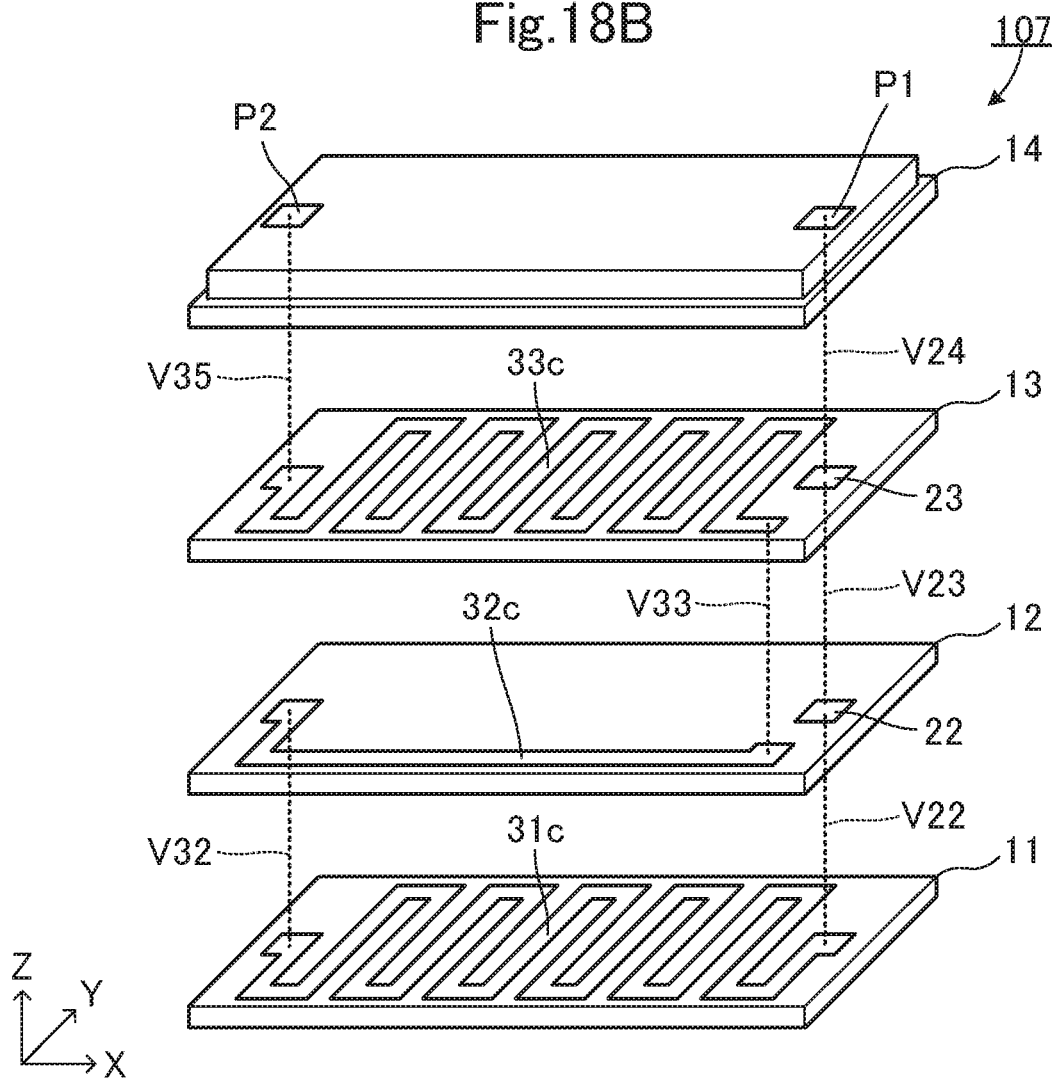
FIG. 18B is an exploded perspective view of the electronic component 107.

FIG. 18A is a sectional view of an electronic component 107 according to the seventh preferred embodiment, and FIG. 18B is an exploded perspective view of the electronic component 107.

The electronic component 107 includes an insulating base material substrate 10L including the first main surface VS1 and the second main surface VS2 opposed to the first main surface VS1, a coil 3C (to be described in detail later) provided on the insulating base material substrate 10L, and the mounting electrodes P1, P2 provided on the first main surface VS1.

An insulating base material substrate 10L is made of a thermoplastic resin having a rectangular or substantially rectangular parallelepiped shape in which the longitudinal direction corresponds to the X-axis direction. The insulating base material substrate 10L includes a recess NT5 provided over the entire or substantially the entire periphery at the outer edge of the first main surface VS1. As illustrated in FIG. 18A, the sectional shape of the recess NT5 has an L-shape.

As illustrated in FIG. 18B, the insulating base material substrate 10L is provided by sequentially laminating the plurality of insulating base material layers 11, 12, 13, 14 made of the thermoplastic resin. In each of the plurality of insulating base material layers 11, 12, 13, 14, a planar shape is a rectangular or substantially rectangular plate shape, and the longitudinal direction corresponds to the X-axis direction.

A coil conductor 31c is provided on the surface of the insulating base material layer 11. The basic configuration of the coil conductor 31c is the same or substantially the same as that of the coil conductor 31b of the fifth preferred embodiment.

A coil conductor 32c and the conductor 22 are provided on the surface of the insulating base material layer 12. The basic configurations of the coil conductor 32c and the conductor 22 are the same or substantially the same as those of the coil conductor 32b and the conductor 22 of the fifth preferred embodiment.

A coil conductor 33c and the conductor 23 are provided on the surface of the insulating base material layer 13. The basic configurations of the coil conductor 33c and the conductor 23 are the same or substantially the same as those of the coil conductor 33c and the conductor 23 of the fifth preferred embodiment.

The two mounting electrodes P1, P2 are provided on the surface of the insulating base material layer 14. The mounting electrode P1 is a rectangular or substantially rectangular conductor disposed near the center of the first side (the right side of the insulating base material layer 14 in FIG. 18B) of the insulating base material layer 14. The mounting electrode P2 is a rectangular or substantially rectangular conductor disposed near the center of the second side (the left side of the insulating base material layer 14 in FIG. 18B) of the insulating base material layer 14.

As illustrated in FIG. 18B, the mounting electrode P1 is connected to the first end of the coil conductor 31c through the conductors 22, 23 and the interlayer connection conductors V22, V23, V24, which are provided in the insulating base material layers 12, 13, 14. The second end of the coil conductor 31c is connected to the first end of the coil conductor 32c through the interlayer connection conductor V32 provided on the insulating base material layer 12. The second end of the coil conductor 32c is connected to the first end of the coil conductor 33c through the interlayer connection conductor V33 provided on the insulating base material layer 13. The second end of the coil conductor 33c is connected to the mounting electrode P2 through the interlayer connection conductor V35 provided in the insulating base material layer 14.

In this manner, the coil 3C is provided in the electronic component 107 and includes the coil conductors 31c, 32c, 33c and the interlayer connection conductors V32, V33, which are provided on the insulating base material layers 11, 12, 13. The coil 3C is provided in the insulating base material substrate 10L, and both ends of the coil 3C are connected to the mounting electrodes P1, P2, respectively.

The area of the first main surface VS1 is smaller than the area of the section (for example, the section of the XY-plane on the −Z direction side with respect to the recess NT5), which is different from the first main surface VS1 in the area and is closest to the first main surface VS1, among sections (sections of the XY-plane) parallel or substantially parallel to the first main surface VS1.

Figure 19A:
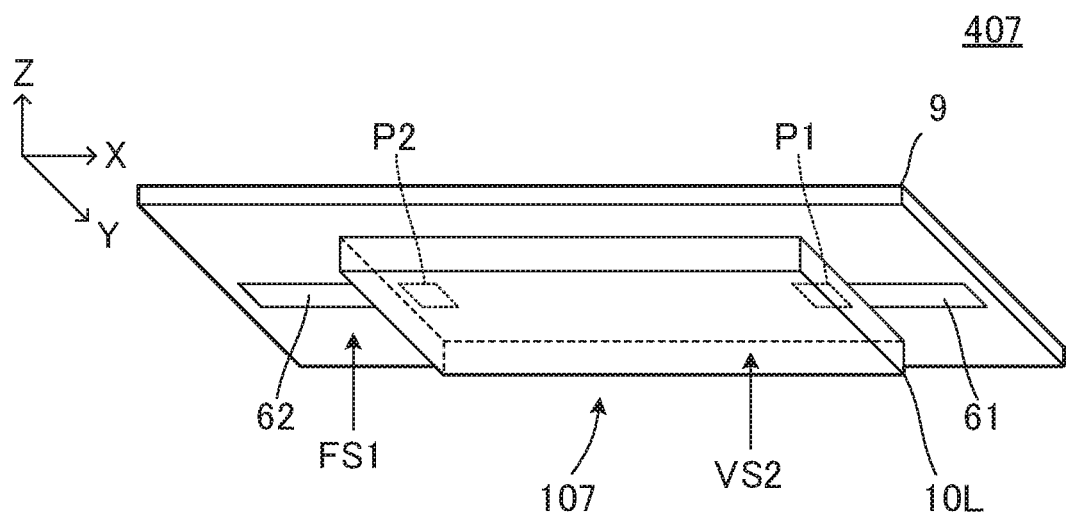
FIG. 19A is a perspective view of a diaphragm 407 of the seventh preferred embodiment of the present invention.
Figure 19B:
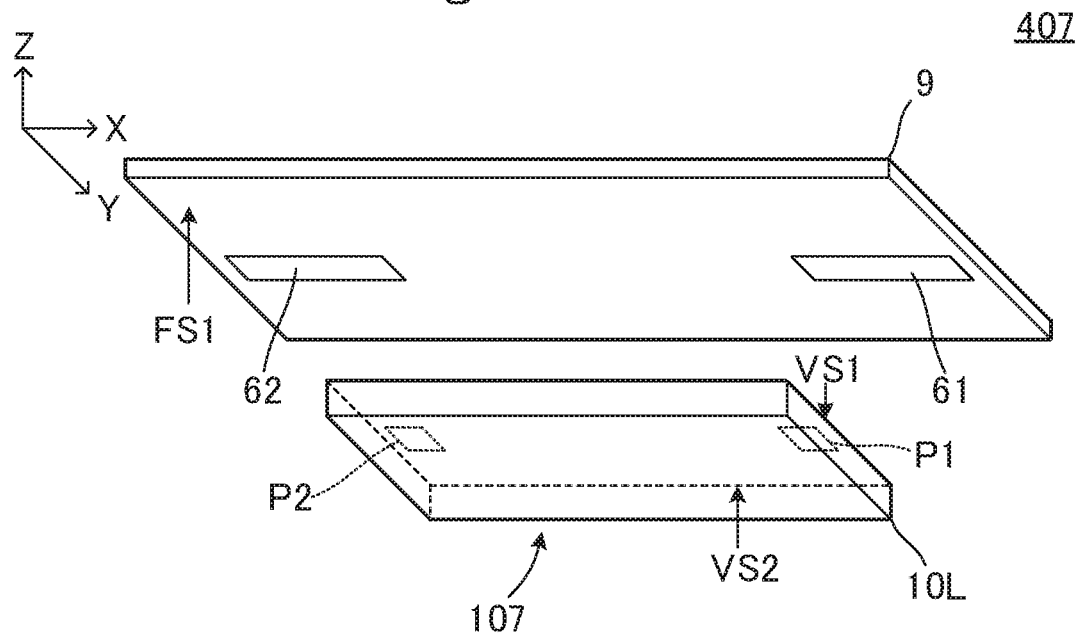
FIG. 19B is an exploded perspective view of the diaphragm 407.
Figure 20:
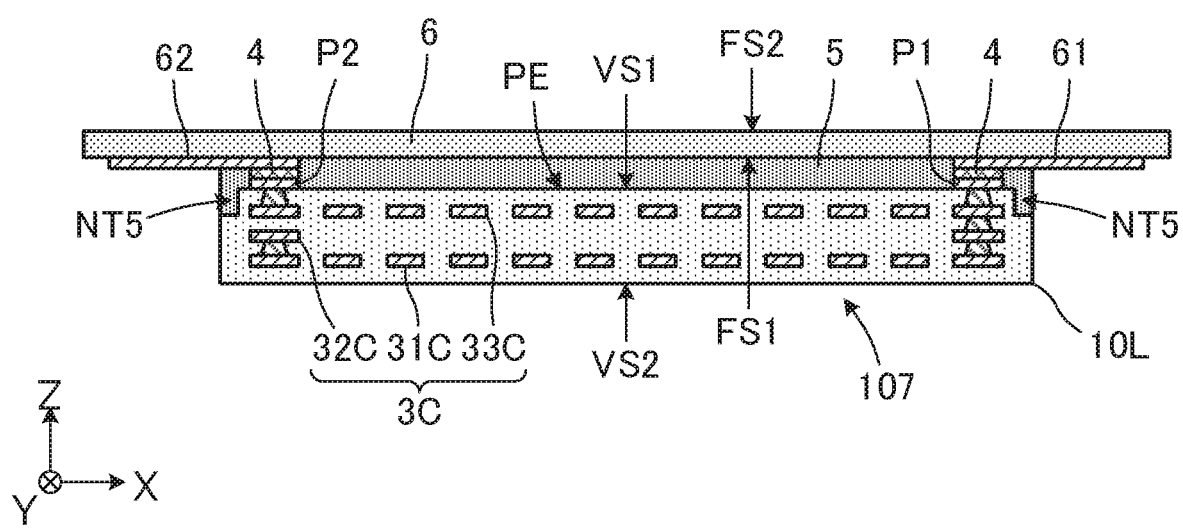
FIG. 20 is a sectional view of the diaphragm 407.

A diaphragm including the electronic component and a support film will be described below with reference to FIGS. 19 and 20. FIG. 19A is a perspective view of a diaphragm 407 of the seventh preferred embodiment, and FIG. 19B is an exploded perspective view of the diaphragm 407. FIG. 20 is a sectional view of the diaphragm 407.

The diaphragm 407 includes the electronic component 107 of the seventh preferred embodiment and a support film 9.

The support film 9 is a rectangular or substantially rectangular insulating sheet having flexibility in which the longitudinal direction corresponds to the X-axis direction, and the support film 9 includes a first surface FS1. A thickness (a thickness in the Z-axis direction) of the support film 9 is smaller than a thickness of the insulating base material substrate 10L. Consequently, the support film 9 has high flexibility. The first surface FS1 of the support film 9 is larger than the first main surface VS1 of the insulating base material substrate 10L included in the electronic component 107. For example, the support film 9 is preferably a film made of polyetheretherketone (PEEK). The elastic modulus (about 4.2 GPa) of the support film 9 made of PEEK is lower than the elastic modulus (about 13.3 GPa) of the insulating base material substrate 10L made of LCP, so that the flexibility of the support film 9 is further improved.

The electronic component 107 is fixed to (mounted on) the support film 9 while the first main surface VS1 of the insulating base material substrate 10L is opposed to the first surface FS1 of the support film 9.

Wiring conductors 61, 62 are provided on the first surface FS1 of the support film 9. The wiring conductor 61 is a linear conductor, which is disposed near the center of the first side (the right side of the support film 9 in FIG. 19B) of the support film 9 and extends in the X-axis direction. The wiring conductor 62 is a linear conductor, which is disposed near the center of the second side (the left side of the support film 9 in FIG. 19B) of the support film 9 and extends in the X-axis direction. For example, each of the wiring conductors 61, 62 is preferably a conductive pattern made of a Cu foil.

The first end (the left end of the wiring conductor 61 in FIG. 19B or 20) of the wiring conductor 61 is connected to the mounting electrode P1 of the electronic component 107 with the conductive bonding material 4 interposed therebetween. The first end (the right end portion of the wiring conductor 62 in FIG. 19B or 20) of the wiring conductor 62 is connected to the mounting electrode P2 of the electronic component 107 with the conductive bonding material 4 interposed therebetween. The bonding portion (the electrode non-forming portion PE and the recess NT5) of the electronic component 107 is bonded to the first surface FS1 of the support film 9 with the insulating bonding material 5 interposed therebetween.

For example, the insulating base material substrate 10K is preferably made of LCP, the conductive bonding material 4 is preferably solder (Sn-3Ag-0.5Cu), and the insulating bonding material 5 is preferably a bonding material of a glass epoxy thermosetting resin. For example, the elastic modulus of the insulating base material substrate 10K preferably ranges from about 12 GPa to about 14 GPa. For example, the elastic modulus of the conductive bonding material 4 is preferably about 41.6 GPa, and the elastic modulus of the insulating bonding material 5 preferably ranges from about 20 GPa to about 25 GPa.

The electronic device including the diaphragm will be described below with reference to FIGS. 21A, 21B and 22.

Figure 21A:
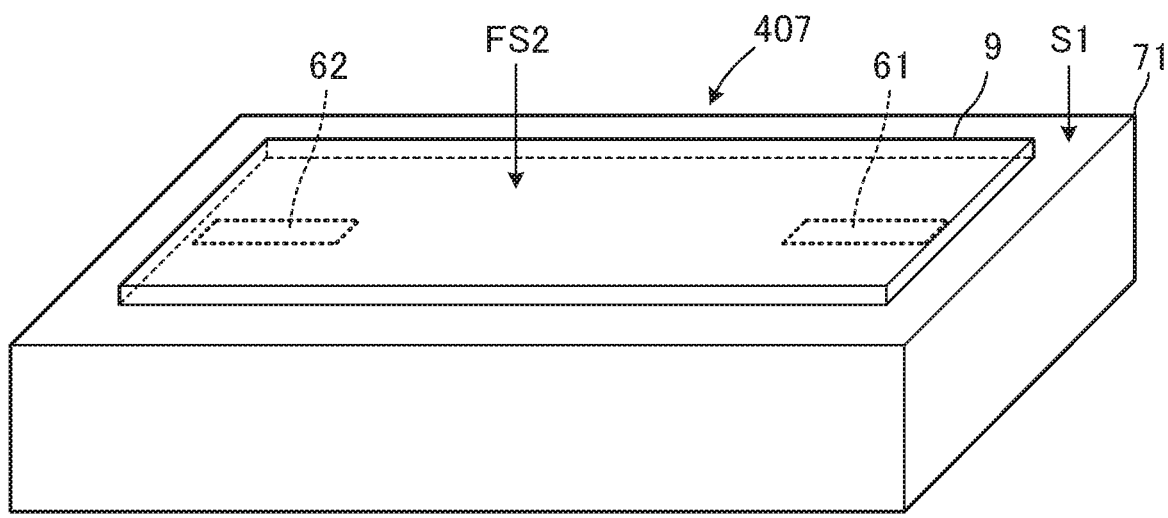
FIG. 21A is a perspective view of a vibration device 507 of the seventh preferred embodiment of the present invention.
Figure 21B:
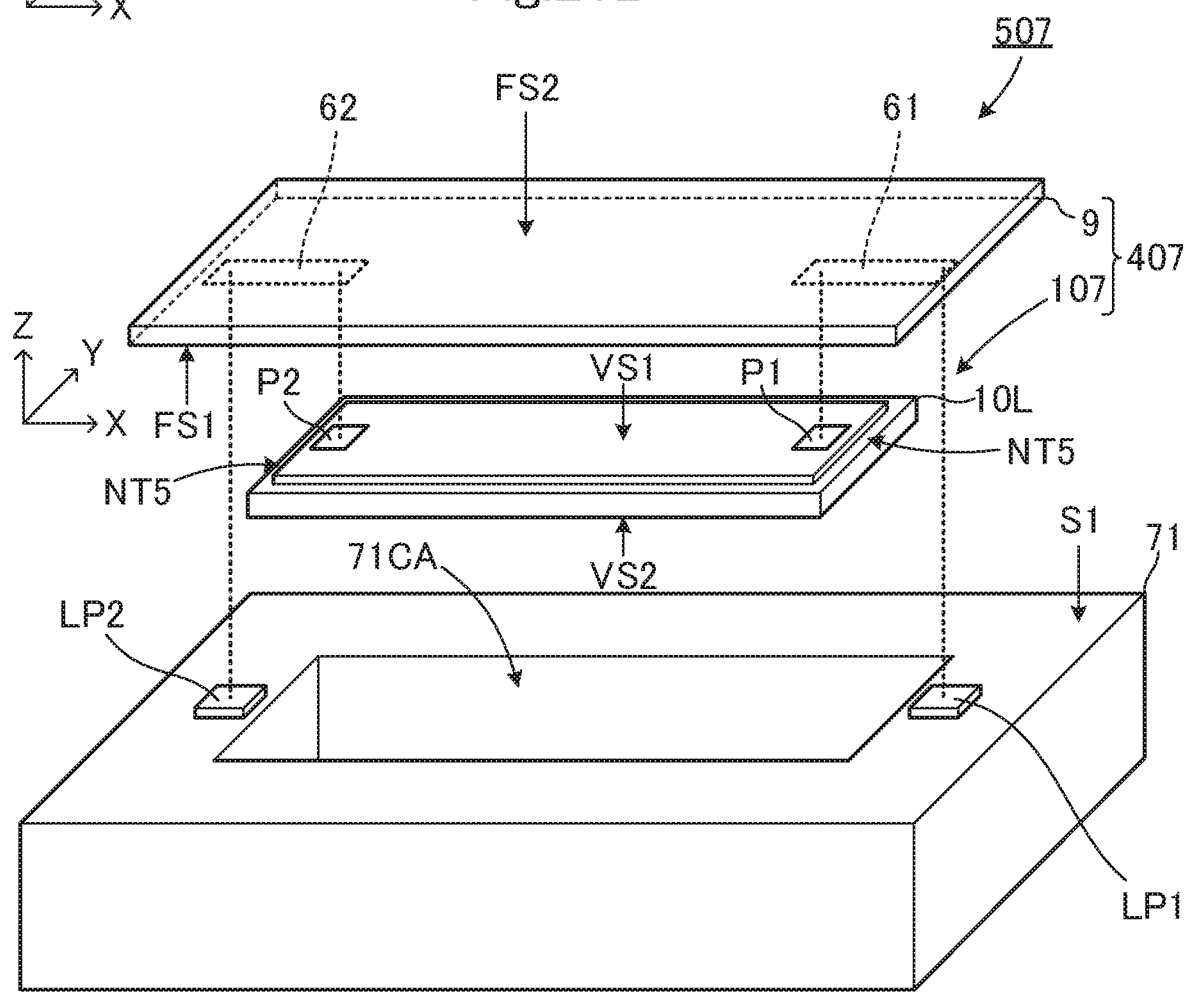
FIG. 21B is an exploded perspective view of the vibration device 507.

FIG. 21A is a perspective view of a vibration device 507 of the seventh preferred embodiment, and FIG. 21B is an exploded perspective view of the vibration device 507. FIG. 22 is a sectional view of the vibration device 507.

The vibration device 507 includes the diaphragm 407 and a casing 71, and the diaphragm 407 is bonded to the casing 71. As illustrated in FIG. 21B, a recess 71CA and the connection conductor patterns LP1, LP2 are provided on the first surface FS1 of the casing 71. The plurality of magnets 8 are provided in the recess 71CA.

Figure 22:
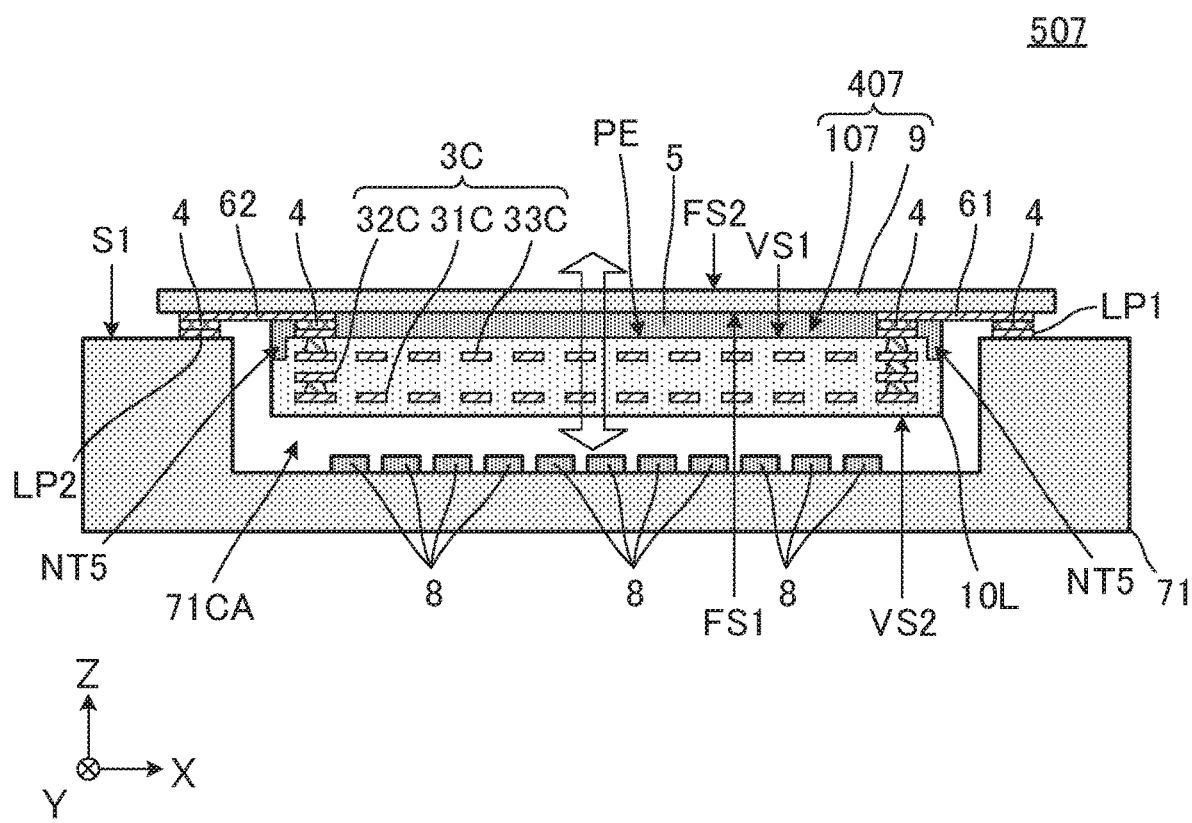
FIG. 22 is a sectional view of the vibration device 507.

As illustrated in FIGS. 21B and 22, the diaphragm 407 is disposed on the casing 71 while the side of the first surface FS1 of the support film 9 is oriented toward the side of the first surface S1 of the casing 71, and the support film 9 is bonded to the top surface of the casing 71. The second end (the right end of the wiring conductor 61 in FIG. 21B) of the wiring conductor 61 is connected to the connection conductor pattern LP1 with the conductive bonding material 4 interposed therebetween. The second end (the left end of the wiring conductor 62 in FIG. 21B) of the wiring conductor 62 is connected to the connection conductor pattern LP2 with the conductive bonding material 4 interposed therebetween. An outer peripheral end of the support film 9 is connected to the first surface S1 of the casing 71 with an adhesive layer (not illustrated) interposed therebetween.

The plurality of magnets 8 are disposed between conductor patterns of the coil conductors 31c, 33c in the X-axis direction such that the S pole and the N pole are alternately opposed to each other. The casing 71 includes terminals (not illustrated) electrically connected to the connection conductor patterns LP1, LP2. The terminal is connected to a circuit of the electronic device when incorporating the vibration device 507 of the seventh preferred embodiment in the electronic device. The driving current is passed through the coil conductors 31c, 32c, 33c of the diaphragm 407 through the connection conductor patterns LP1, LP2, such that the diaphragm 407 vibrates in the direction indicated by an outlined arrow in FIG. 22.

According to the seventh preferred embodiment, the following advantageous effects are obtained.

When the diaphragm 407 vibrates repeatedly, the stress is generated at the interface between the insulating base material substrate 10L and the support film 9, and peeling is easily generated at the interface between the electrode non-forming portion PE of the insulating base material substrate 10L and the insulating bonding material 5. In the case in which the diaphragm is bonded to the support film 9 without using the insulating bonding material (using only the conductive bonding material 4) while the areas of the mounting electrodes P1, P2 are increased, the stress is concentrated on the interface between the electrodes P1, P2 of the diaphragm and the conductive bonding material 4 during the vibration, and the diaphragm is easily peeled off from the support film 9. On the other hand, the electronic component 107 of the seventh preferred embodiment includes the recess NT5 provided at the outer edge of the first main surface VS1, and the recess NT5 and the electrode non-forming portion PE are bonded to the support film 9 with the insulating bonding material 5 interposed therebetween. With this configuration, as compared with the case in which only the electrode non-forming portion of the insulating base material substrate 10L is bonded to the support film 9 with the insulating bonding material 5 interposed therebetween, the area in which the insulating base material substrate 10L contacts with the insulating bonding material 5 is increased to improve the bonding strength between the insulating base material substrate 10L and the insulating bonding material 5. Thus, with this configuration, the diaphragm in which the peeling of the interface between the insulating base material substrate 10L and the insulating bonding material 5 is prevented to improve the bonding reliability to the support film 9 is obtained.

The area of the recess NT5 is preferably large. When the recess NT5 having the large area is bonded to the support film 9 with the insulating bonding material 5 interposed therebetween, the bonding strength between the insulating base material substrate and the insulating bonding material 5 is further increased to prevent the peeling of the interface between the insulating base material substrate and the insulating bonding material 5.

In the case in which the insulating base material substrate is thickened in the Z-axis direction (the laminating direction), the insulating base material substrate is not significantly deformed by following the deformation of the support film 9 during the vibration, so that the stress is concentrated on the interface between the insulating base material substrate and the insulating bonding material to particularly easily generate the peeling of the interface between the insulating base material substrate and the insulating bonding material. Even in such cases, according to the above-described configuration, the peeling of the interface between the insulating base material substrate and the insulating bonding material is not significantly generated.

In the seventh preferred embodiment, the support film 9 is thinner than the insulating base material substrate 10L, and the elastic modulus is low, so that a displacement amplitude of the diaphragm 407 to the electromagnetic force is not significantly obstructed by the support film 9.

In the seventh preferred embodiment, the coil conductors 31c, 32c, 33c provided on the plurality of insulating base material layers 11, 12, 13, respectively, are provided, so that the compact diaphragm having the strong electromagnetic force is obtained. The coil conductors 31c, 33c overlap each other when viewed from the Z-axis direction, so that the coil conductor contributing to the electromagnetic force has high density of the current path.

Eighth Preferred Embodiment

An example of a diaphragm including a thick portion in the vibrator VP will be described in an eighth preferred embodiment of the present invention.

Figure 23A:
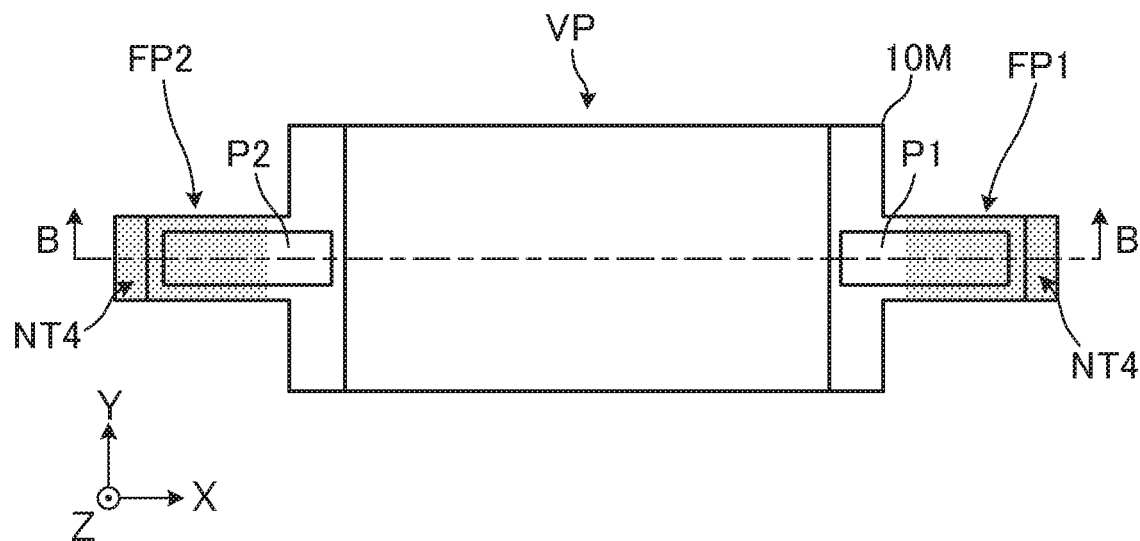
FIG. 23A is a plan view illustrating supports FP1, FP2 of a diaphragm 408 according to an eighth preferred embodiment of the present invention.
Figure 23B:
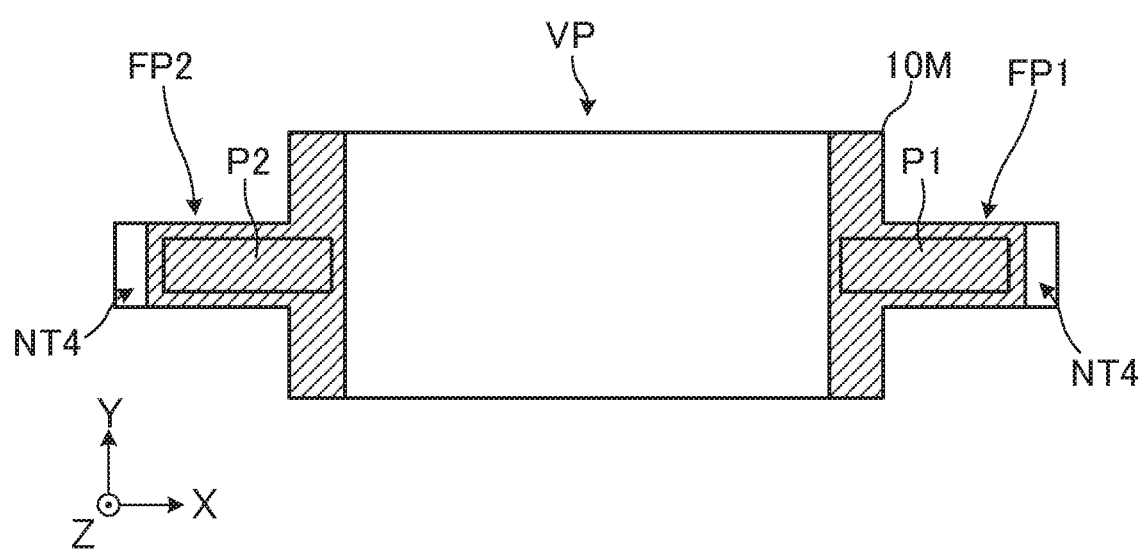
FIG. 23B is a plan view illustrating first main surfaces VS1A, VS1B of the diaphragm 408.
Figure 24:
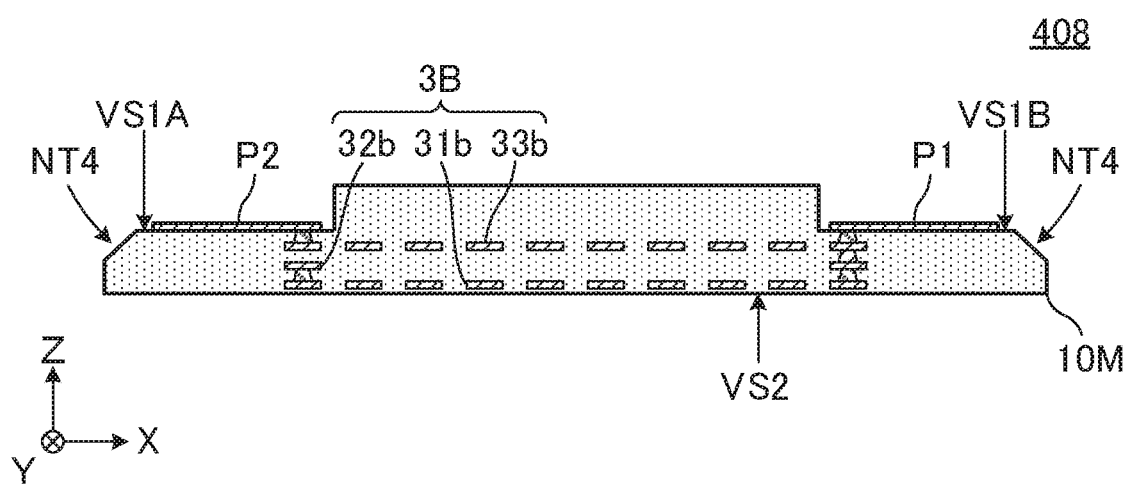
FIG. 24 is a sectional view taken along a line B-B in FIG. 23A.

FIG. 23A is a plan view illustrating supports FP1, FP2 of a diaphragm 408 according to an eighth preferred embodiment, and FIG. 23B is a plan view illustrating first main surfaces VS1A, VS1B of the diaphragm 408. FIG. 24 is a sectional view taken along a line B-B in FIG. 23A. In FIG. 23A, the supports FP1, FP2 are indicated by dot patterns in order to easily understand the structure. In FIG. 23B, the first main surfaces VS1A, VS1B are indicated by hatching.

The diaphragm 408 includes an insulating base material substrate 10M including the first main surfaces VS1A, VS1B and the second main surface VS2 opposed to the first main surfaces VS1A, VS1B, the coil 3B provided on the insulating base material substrate 10M, and the mounting electrodes P1, P2 provided on the first main surfaces VS1A, VS1B. The diaphragm 408 is different from the diaphragm 405 of the fifth preferred embodiment in that the diaphragm 408 includes the thick portion in the vibrator VP of the insulating base material substrate 10M. Other configurations are the same or substantially the same as those of the diaphragm 405.

Portions different from the diaphragm 405 and the vibration device 505 of the fifth preferred embodiment will be described below.

As described above, the insulating base material substrate 10M includes the thick portion in the vibrator VP. The thick portion is a portion in which the thickness in the laminating direction (Z-axis direction) of the plurality of insulating base material layers is relatively larger than that of other portions (for example, the supports FP1, FP2). The supports FP1, FP2 are relatively thin, and the amplitude of the diaphragm by the electromagnetic force is able to be increased while the flexibility is maintained.

The first main surfaces VS1A, VS1B of the insulating base material substrate 10M of the eighth preferred embodiment are a surface including the bonding portion bonded to another member (casing 70). The bonding portion of the eighth preferred embodiment is a portion bonded to another member in the supports FP1, FP2.

The areas (a total area of the first main surfaces VS1A, VS1B) of the first main surfaces VS1A, VS1B of the insulating base material substrate 10M are smaller than the area of the section (for example, the section parallel or substantially parallel to the XY-plane in the −Z direction with respect to the first main surfaces VS1A, VS1B in the insulating base material substrate 10M in FIG. 24), which is different from the first main surfaces VS1A, VS1B in the area and is closest to the first main surfaces VS1A, VS1B, among sections (sections of the XY-plane) parallel or substantially parallel to the first main surfaces VS1A, VS1B.

Figure 25:
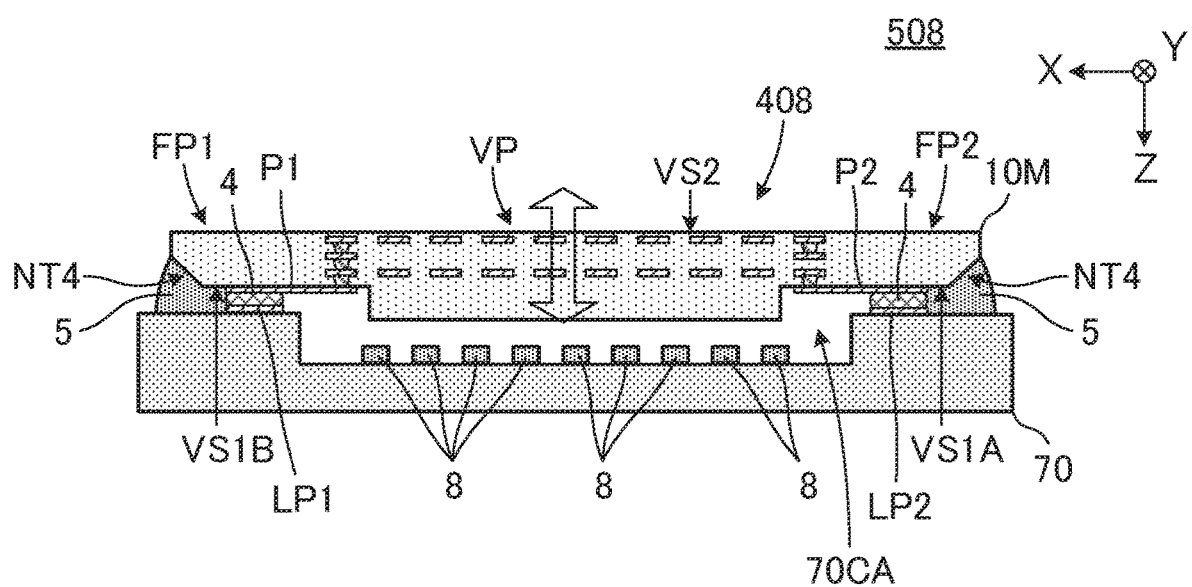
FIG. 25 is a sectional view of a vibration device 508 of the eighth preferred embodiment of the present invention.

The electronic device including the diaphragm will be described below with reference to FIG. 25. FIG. 25 is a sectional view of a vibration device 508 of the eighth preferred embodiment.

The vibration device 508 includes the diaphragm 408 and the casing 70. As illustrated in FIG. 25, the mounting electrode P1 is connected to the connection conductor pattern LP1 with the conductive bonding material 4 interposed therebetween. The mounting electrode P2 is connected to the connection conductor pattern LP2 with the conductive bonding material 4 interposed therebetween. The bonding portion (the side of the first main surface VS1A in the support FP1, the side of the first main surface VS1B in the support FP2, and the recess NT4) of the diaphragm 408 is connected to the first surface S1 of the casing 70 with the insulating bonding material 5 interposed therebetween.

Even in such a configuration, the same actions and advantageous effects as the vibration device 505 of the fifth preferred embodiment are obtained.

In each of the above-described preferred embodiments, by way of example, the insulating base material substrate has the rectangular or substantially rectangular parallelepiped shape. However, the present invention is not limited to this configuration. The shape of the insulating base material substrate may appropriately be changed within a range in which the actions and advantageous effects of preferred embodiments of the present invention are obtained. For example, the insulating base material substrate may have a cube shape, a polygonal prism shape, a circular column shape, and an elliptic column shape, and the planar shape of the insulating base material substrate may be an L-shape, a crank shape, a T-shape, and a Y-shape.

In each of the above-described preferred embodiments, by way of example, the insulating base material substrate is provided by laminating three or four insulating base material layers. However, the present invention is not limited to this configuration. The number of insulating base material layers may be appropriately changed within the range in which the actions and advantageous effects of preferred embodiments of the present invention are obtained.

In each of the above-described preferred embodiments, by way of example, the coil provided on the insulating base material substrate includes the coil conductor having the spiral shape, the inverted conical shape, or the meander line shape. However, the present invention is not limited to this configuration. The shape and the number of windings of the coil may be appropriately changed within the range in which the actions and advantageous effects of preferred embodiments of the present invention are obtained. For example, the coil may have a helical shape, or a planar loop shape. The direction of the winding axis AX of the coil may also be appropriately changed within the range in which the actions and advantageous effects of preferred embodiments of the present invention are obtained. For example, the winding axis AX of the coil may correspond to the X-axis direction or the Y-axis direction.

Further, the shape, the number, and the position of the recess may also be appropriately changed within the range in which the actions and advantageous effects of preferred embodiments of the present invention are obtained. As in the third, fifth or sixth preferred embodiments, the recess may be provided only in a portion of the entire periphery of the first main surface VS1. However, in the case in which the entire electrode non-forming portion PE is bonded to another member with the insulating bonding material 5 interposed therebetween, preferably the recess is provided over the entire or substantially the entire periphery of the first main surface VS1.

In each of the above-described preferred embodiments, by way of example, the second main surface VS2 of the insulating base material substrate has a planar shape. However, the present invention is not limited to this configuration. The second main surface VS2 may have a curved shape.

In each of the above-described preferred embodiments, by way of example, the two mounting electrodes P1, P2 have the linear shape or the planar shape is rectangular or substantially rectangular. However, the present invention is not limited to this configuration. The shape of the mounting electrode may be appropriately changed within a range in which the actions and advantageous effects of preferred embodiments of the present invention are obtained. For example, the mounting electrode may have a square shape, a polygonal shape, a circular shape, an elliptical shape, an L-shape, and a T-shape. The disposition and the number of the mounting electrodes may be appropriately changed depending on the circuit configuration of the electronic component or the diaphragm.

In each of the above-described preferred embodiments, by way of example, the insulating base material substrate is made of the thermoplastic resin. However, the present invention is not limited to this configuration. The insulating base material substrate may be made of a thermosetting resin, for example. The insulating base material substrate of the electronic component may be made of ceramic, for example. In the case in which the insulating base material substrate is made of thermoplastic resin, as described above, the manufacturing time is reduced in the process of manufacturing the insulating base material substrate, and the cost is reduced to a low level.

In each of the above-described preferred embodiments, by way of example, only the coil is provided on the insulating base material substrate in the electronic component or the diaphragm. However, the present invention is not limited to this configuration. In addition to the coil, the electronic component or the diaphragm may include a capacitor defined by a conductor. A chip component (a resistor, an inductor, a capacitor) may be mounted on the electronic component and the diaphragm.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    an insulating base material substrate including a first main surface defining a mounting surface, the insulating base material substrate including a plurality of insulating base material layers that are laminated in a lamination direction;
    a coil including a coil conductor provided on at least one of the plurality of insulating base material layers and including a winding axis extending in the lamination direction; and
    a mounting electrode that is provided on the first main surface and connected to the coil; wherein
    an area of the first main surface is smaller than an area of a section, which is different in area from the first main surface and is closest to the first main surface, among sections parallel or substantially parallel to the first main surface; and
    an entirety or substantially an entirety of the first main surface is disposed inside a section having the largest area among the sections parallel or substantially parallel to the first main surface when viewed from the lamination direction.

2. The electronic component according to claim 1, wherein a plurality of coil conductors are provided on at least two of the plurality of insulating base material layers.

3. The electronic component according to claim 1, wherein
    the insulating base material substrate includes a second main surface opposed to the first main surface; and
    the insulating base material substrate has a tapered shape in which the area of the first main surface is smaller than the area of the second main surface.

4. The electronic component according to claim 1, wherein the insulating base material substrate includes a recess provided in at least a portion of an outer edge of the first main surface.

5. The electronic component according to claim 4, wherein the recess has an L-shaped sectional shape.

6. The electronic component according to claim 1, wherein an uneven portion is provided in an electrode non-forming portion in the first main surface in which the mounting electrode is not provided.

7. The electronic component according to claim 6, wherein the uneven portion includes a groove provided in the electrode non-forming portion.

8. A diaphragm that vibrates by electromagnetic force comprising:
    a support film having flexibility;
    a wiring conductor provided on the support film; and
    an electronic component bonded to the support film with a conductive bonding material and an insulating bonding material interposed therebetween; wherein
    the electronic component includes:
        an insulating base material substrate including a first main surface defining a mounting surface, the insulating base material substrate including a plurality of insulating base material layers that are laminated in a lamination direction;
        a coil including a coil conductor provided on at least one of the plurality of insulating base material layers; and
        a mounting electrode provided on the first main surface and connected to the coil; and
    an area of the first main surface is smaller than an area of a section, which is different in area from the first main surface and is closest to the first main surface, among sections parallel or substantially parallel to the first main surface.

9. The diaphragm according to claim 8, wherein the insulating base material substrate includes a recess provided at an outer edge of the first main surface.

10. The diaphragm according to claim 9, wherein the recess has an L-shaped sectional shape.

11. A diaphragm that vibrates by electromagnetic force comprising:
    an insulating base material substrate including a vibrator that vibrates, a support fixed to another member, and a first main surface including a bonding portion bonded to the another member, and the insulating base material substrate including a plurality of insulating base material layers that are laminated in a lamination direction;
    a coil including a coil conductor provided on at least one of the insulating base material layers; and
    a mounting electrode provided on the first main surface and connected to the coil; wherein
    an area of the first main surface is smaller than an area of a section, which is different in area from the first main surface and closest to the first main surface, among sections parallel or substantially parallel to the first main surface.

12. The diaphragm according to claim 11, wherein the insulating base material substrate includes a recess provided at an outer edge of the support in the first main surface.

13. The diaphragm according to claim 11, wherein a width of the support is narrower than a width of the vibrator.

14. An electronic device comprising:
    a mounting substrate; and
    an electronic component mounted on the mounting substrate with a conductive bonding material and an insulating bonding material; wherein
    the electronic component includes:
        an insulating base material substrate including a first main surface defining a mounting surface, the insulating base material substrate including a plurality of insulating base material layers that are laminated in a lamination direction;
        a coil including a coil conductor provided on at least one of the insulating base material layers and including a winding axis extending in the lamination direction; and
        a mounting electrode provided on the first main surface and connected to the coil;
    an area of the first main surface is smaller than an area of a section, which is different in area from the first main surface and is closest to the first main surface, among sections parallel or substantially parallel to the first main surface;
    an entirety or substantially an entirety of the first main surface is disposed inside a section having the largest area among the sections parallel or substantially parallel to the first main surface when viewed from the laminating direction;

the mounting electrode is connected to the mounting substrate with the conductive bonding material interposed therebetween;

the insulating base material substrate includes a recess provided in an end surface connected to the first main surface or an outer edge of the first main surface; and an electrode non-forming portion in the first main surface in which the mounting electrode is not provided is bonded to the mounting substrate together with at least a portion of the end surface or the recess with the insulating bonding material interposed therebetween.

15. An electronic component manufacturing method comprising:

providing a plurality of insulating base material layers;

forming a coil conductor on at least one of the plurality of insulating base material layers;

laminating the plurality of insulating base material layers;

forming an insulating base material substrate by heating and pressurizing the plurality of laminated insulating base material layers after forming the coil conductor;

forming a mounting electrode on a first main surface of the insulating base material substrate; and forming a recess in the first main surface such that an entirety or substantially an entirety of the first main surface is disposed inside a section having a largest area among sections parallel or substantially parallel to the first main surface when viewed from a laminating direction after the base material forming step.

16. The electronic component manufacturing method according to claim 15, wherein each of the plurality of insulating base material layers is made of a thermoplastic resin; and forming the insulating base material substrate includes collectively pressing the plurality of laminated insulating base material layers.

17. The electronic component manufacturing method according to claim 15, wherein forming the mounting electrode includes forming the mounting electrode on a surface of the insulating base material layer that becomes the first main surface of the insulating base material substrate before forming the insulating base material substrate.

18. An electronic component manufacturing method comprising:

providing a plurality of insulating base material layers;

forming a coil conductor on at least one of the plurality of insulating base material layers;

laminating the plurality of insulating base material layers;

forming an insulating base material substrate by heating and pressurizing the plurality of laminated insulating base material layers after forming the coil conductor;

forming a mounting electrode on a first main surface of the insulating base material substrate; and separating the insulating base material substrate into individual pieces by grinding the insulating base material substrate from a first main surface side with a laser beam such that an area of the first main surface is smaller than an area of a section, which is different in area from the first main surface and closest to the first main surface, among sections parallel or substantially parallel to the first main surface, and such that an entirety or substantially an entirety of the first main surface is disposed inside a section having the largest area among the sections parallel or substantially parallel to the first main surface when viewed from a laminating direction.

19. The electronic component manufacturing method according to claim 18, wherein each of the plurality of insulating base material layers is made of a thermoplastic resin; and forming the insulating base material substrate includes collectively pressing the plurality of laminated insulating base material layers.

20. The electronic component manufacturing method according to claim 18, wherein forming the mounting electrode includes forming the mounting electrode on a surface of the insulating base material layer that becomes the first main surface of the insulating base material substrate before forming the insulating base material substrate.

* * * * *